US007244547B2

(12) United States Patent
Goto

(10) Patent No.: US 7,244,547 B2
(45) Date of Patent: Jul. 17, 2007

(54) PHOTOSENSITIVE COMPOSITION AND IMAGE RECORDING MATERIAL USING THE SAME

(75) Inventor: Takahiro Goto, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/953,403

(22) Filed: Sep. 30, 2004

(65) Prior Publication Data

US 2005/0100821 A1 May 12, 2005

(30) Foreign Application Priority Data

Oct. 1, 2003 (JP) ............................. 2003-343373

(51) Int. Cl.
*G03F 7/029* (2006.01)

(52) U.S. Cl. ............................... 430/286.1; 430/281.1; 430/287.1

(58) Field of Classification Search ..................... None
See application file for complete search history.

(56) References Cited

U.S. PATENT DOCUMENTS 6,569,603 B2 * 5/2003 Furukawa ................ 430/287.1
6,739,260 B2 * 5/2004 Damme et al. ............. 101/465

FOREIGN PATENT DOCUMENTS

| | | | |
|---|---|---|---|
| DE | 102 06 364 | A1 | 9/2002 |
| EP | 1 516 743 | A1 | 3/2005 |
| EP | 1 518 673 | A2 | 3/2005 |
| JP | 7-20629 | A | 1/1995 |
| JP | 7-271029 | A | 10/1995 |
| JP | 11-212252 | A | 8/1999 |
| JP | 11-231535 | A | 8/1999 |
| JP | 2001-290271 | A | 10/2001 |
| JP | 2002-278081 | A | 9/2002 |
| JP | 2003-29408 | A | 1/2003 |
| JP | 2003-43687 | A | 2/2003 |

OTHER PUBLICATIONS

European Search Report dated Oct. 31, 2005.

* cited by examiner

*Primary Examiner*—Barbara L. Gilliam
(74) *Attorney, Agent, or Firm*—Sughrue Mion, PLLC

(57) ABSTRACT

A photosensitive composition that includes a compound which generates a radical upon being heated or exposed to light; a polymer having on a side chain thereof a phenyl group substituted by a vinyl group; a monomer having in a molecule thereof at least two phenyl groups each substituted by a vinyl group; an infrared absorbent; and a dye having absorption maximum wavelength in a range from 500 to 700 nm, and an image recording material which has the photosensitive layer disposed on a support.

19 Claims, 2 Drawing Sheets

PHOTOSENSITIVE COMPOSITION AND IMAGE RECORDING MATERIAL USING THE SAME

CROSS-REFERENCE TO RELATED APPLICATION

This application claims priority under 35 USC 119 from Japanese Patent Application No. 2003-343373, the disclosure of which is incorporated by reference herein.

BACKGROUND OF THE INVENTION

1. Field of the Invention

The present invention relates to a photosensitive composition and an image recording material using the same. More particularly, the present invention relates to an infrared laser photosensitive composition that is suitable for a planographic printing plate precursor and the like for what is referred to as direct plate making, which allows plates to be directly produced based on digital signals from a computer or the like. The present invention further relates to an image recording material using the photosensitive composition.

2. Description of the Related Art

Recent development of lasers has been remarkable, and, in particular, progress is being made with respect to high output and miniaturization in solid-state lasers and semiconductor lasers having an emission region in the near infrared to infrared regions. Accordingly, such lasers are extremely useful as exposure light sources during the direct production of printing plates based on digital data from computers and the like.

Negative planographic printing plate precursors for infrared lasers are used with infrared lasers that emit infrared rays as exposure light sources. Such planographic printing plate precursors are employed in recording methods that produce an image portion through polymerization reaction with a radical generated by light or heat serving as an initiator, so as to cure a recording layer at an exposed portion thereof where the image portion is to be formed. Alternatively, in this method, when a dye is used as an infrared absorbent, a radical generated by electron-transfer from the dye that has absorbed the infrared ray is used as the initiator of the polymerization.

For use in such recording methods, combinations of resol resins, novolak resins, infrared absorbents and photoacid generators have been proposed, for example, in Japanese Patent Application Laid-Open (JP-A) Nos. 7-20629 and 7-271029. Further, combinations of specific polymers, photoacid generators and near infrared sensitizing dyes have also been proposed, for example, in JP-A Nos. 11-212252 and 11-231535.

However, with polymerizable compositions featuring the use of photopolymerization initiators or photoacid generators such as those described above, it is difficult to impart sufficiently high photosensitivity in the near infrared regions. The photosensitivity is particularly insufficient when such polymerizable compositions are applied to scanning exposure using infrared laser light.

Polymerization using photopolymerization initiators or photoacid generators is often insufficient with exposure to light alone. Thus, when the above-described polymerizable compositions are to be used in planographic printing plate precursors, heat processing is necessarily conducted after the precursor is exposed to light or developed, in order to accelerate and complete polymerization. The heat processing has therefore been among important steps during plate-making. However, the heat processing may become a cause of reduced production efficiency as well as unstable image quality. Potential problems involved in the heat processing are that, when the heating is insufficient, even portions which have been exposed to light are dissolved, and that, when the heating temperature is too high, portions which have not been exposed to light partially become insoluble, whereby non-image portions are insufficiently developed. Those problems may result from difficulty in maintaining a uniform difference in solubility between exposed portions and unexposed portions.

In order to solve such problems, photosensitive planographic printing plate precursors that can be subjected to scan-exposure without requiring heat processing or provision of an overcoat layer are proposed (see, for example, JP-A Nos. 2001-290271, 2002-278081, 2003-29408 and 2003-43687). However, these planographic printing plate precursors lack suficient storage stability and stability under safelight illumination.

Accordingly, an object of the present invention is to provide a photosensitive composition with high photosensitivity to infrared light, good storage stability and stability under safelight illumination, and an image recording material using the same.

Another object of the present invention is to provide an image recording material suitable for a planographic printing plate precursor with good plate-comparability after plate-making.

SUMMARY OF THE INVENTION

In accordance with a first aspect of the present invention, there is provided a photosensitive composition comprising: a compound (A) which generates a radical upon being heated or exposed to light; a polymer (B) having on a side chain thereof a phenyl group substituted by a vinyl group; a monomer (C) having in a molecule thereof at least two phenyl groups each substituted by a vinyl group; an infrared absorbent (D); and a dye (E) having absorption maximum wavelength in a range from 500 to 700 nm.

In accordance with a second aspect of the present invention, there is provided an image recording material having a photosensitive layer disposed on a support, the photosensitive layer including a photosensitive composition that comprises: a compound (A) which generates a radical upon being heated or exposed to light; a polymer (B) having on a side chain thereof a phenyl group substituted by a vinyl group; a monomer (C) having in a molecule thereof at least two phenyl groups each substituted by a vinyl group; an infrared absorbent (D); and a dye (E) having absorption maximum wavelength in a range from 500 to 700 nm.

DETAILED DESCRIPTION OF THE INVENTION

Figure 1:
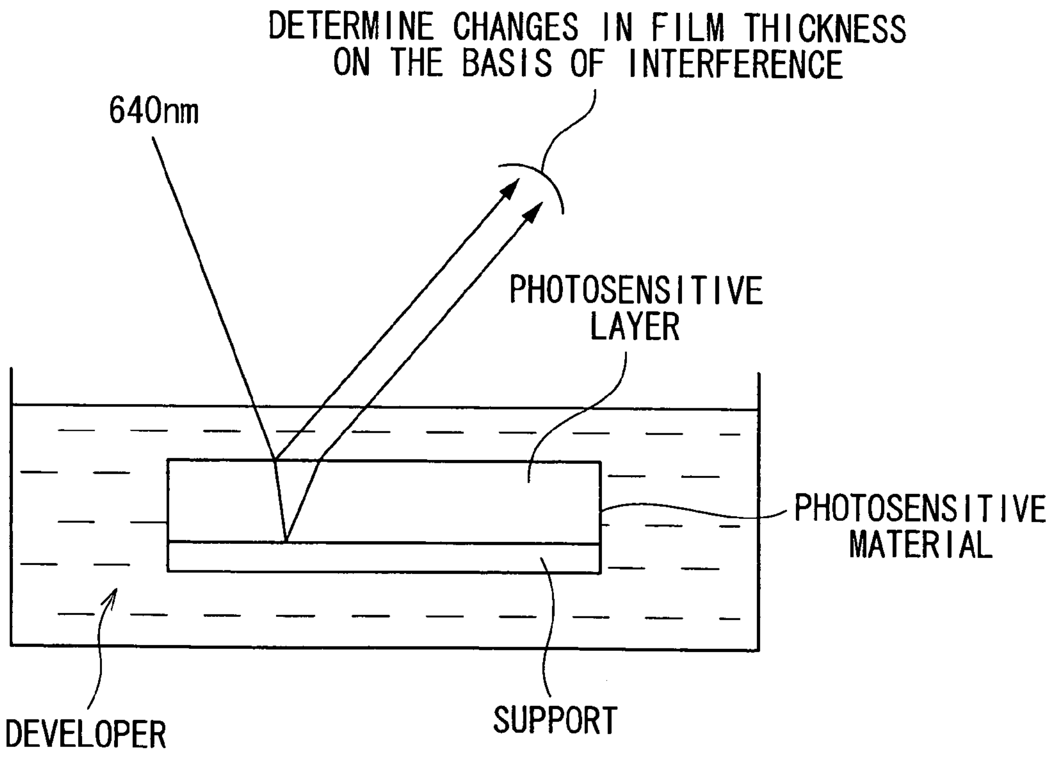
FIG. 1 is a schematic structural view illustrating an example of a DRM interference potential measuring device used to determine dissolution behavior of a photosensitive layer.

Effects of the present invention still remain unclear, but have been assumed as follows.

The dye having absorption maximum wavelength ranging from 500 to 700 nm in the photosensitive composition of the present invention also serves as a polymerization inhibitor. The dye therefore contributes to improve storage stability and stability under safelight illumination of the photosensitive composition. Having such a dye contained in the photosensitive composition with high photosensitivity to infrared light, i.e., the composition that includes a compound which generates a radical upon being heated or exposed to light; a polymer having on a side chain thereof a phenyl group substituted by a vinyl group; a monomer having in a molecule thereof at least two phenyl groups each substituted by a vinyl group; and an infrared absorbent, it is assumed that the photosensitive composition with high photosensitivity to infrared light, good storage stability and stability under safelight illumination could be provided. Further, it is evident that, when a dye having absorption maximum wavelength in a range from 500 to 700 nm is included in a photosensitive layer of an image recording material, what is referred to as plate-comparability (i.e., visibility or applicability to an image density measuring device) as a printing plate after plate-making is improved.

In accordance with the present invention, a photosensitive composition with high photosensitivity to infrared light, good storage stability and stability under safelight illumination, and an image recording material using the same can be provided. Further, an image recording material suitable for a planographic printing plate precursor with good plate-comparability after plate-making can be provided.

DETAILED DESCRIPTION OF THE INVENTION

The present invention is described in detail below.

<Photosensitive Composition>

The photosensitive composition of the present invention is characterized by including: a compound (A) which generates a radical upon being heated or exposed to light; a polymer (B) having on a side chain thereof a phenyl group substituted by a vinyl group; a monomer (C) having in a molecule thereof at least two phenyl groups each substituted by a vinyl group; an infrared absorbent (D); and a dye (E) having absorption maximum wavelength in a range from 500 to 700 nm.

Each component of the photosensitive composition is described below.

<(E) Dye Having Absorption Maximum Wavelength in a Range from 500 to 700 nm>

The photosensitive composition of the present invention includes a dye having absorption maximum wavelength in a range from 500 to 700 nm (hereinafter, sometimes referred to as "specific dye").

Having the specific dye functioning as a polymerization inhibitor, storage stability and stability under safelight illumination of the photosensitive composition of the present invention improves remarkably. Further, the planographic printing plate precursor that includes the photosensitive composition of the present invention has improved plate-comparability (i.e., visibility or applicability to an image density measuring device) as a printing plate after plate-making.

It should be noted that dyes having absorption maximum wavelength in a wavelength shorter than 500 nm are undesirable due to their insufficient plate-comparability and stability under safelight illumination. Dyes having absorption maximum wavelength in a wavelength longer than 700 nm are included in infrared absorbent (D) (described later) and thus are excluded from the component (E).

The photosensitive composition of the present invention essentially includes at least one dye with a great effect on polymerization inhibition (i.e., a specific dye). Presumably the effect on polymerization inhibition of the specific dye (E) is expressed due to the dye structure that includes a nitrogen atom with a radical-trapping effect. Dyes having such a structure are preferably used as specific dyes (E) in the present invention. A pigment whose absorption wavelength is in the same range as that of the above-described dye cannot be used alone in the present invention because of the insufficient effect thereof as a polymerization inhibitor. It should be noted that, however, such a pigment can be used in combination with the specific dye (E).

Examples of specific dyes (E) include a triarylmethane dye, an azo dye, an anthraquinone dye, a cyanine dye that have absorption maximum wavelength in the above-described range. Among these, the triarylmethane dye is preferable. Examples of the specific dyes (d-1 to d-7) are illustrated below, but are not limited thereto.

D-1

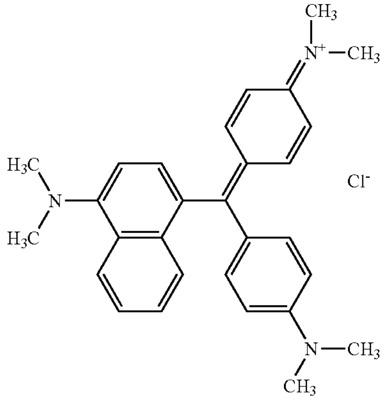

D-2

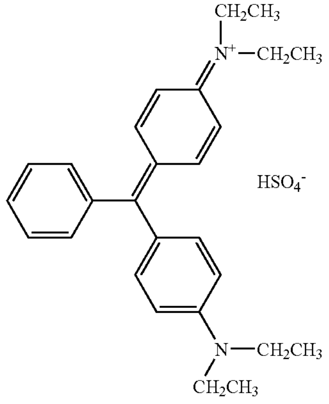

D-3

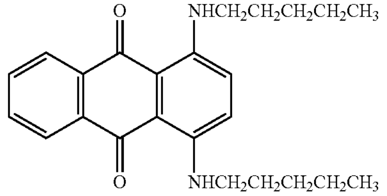

-continued

D-4

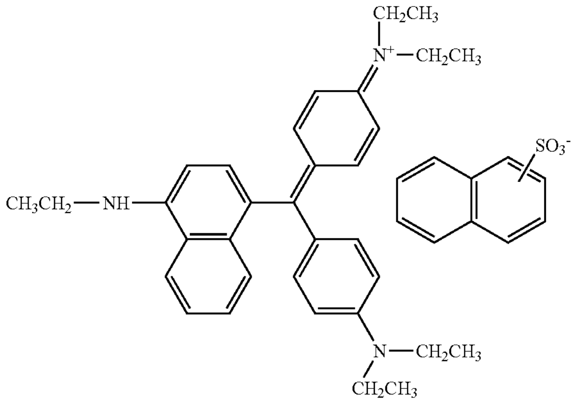

D-5

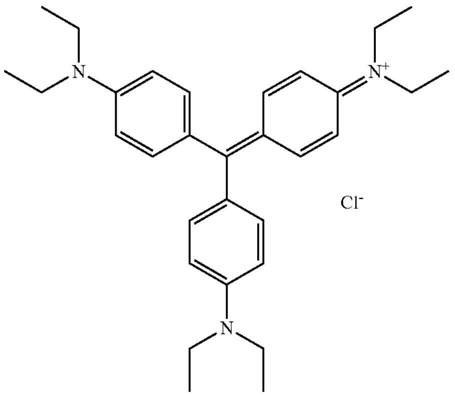

D-6

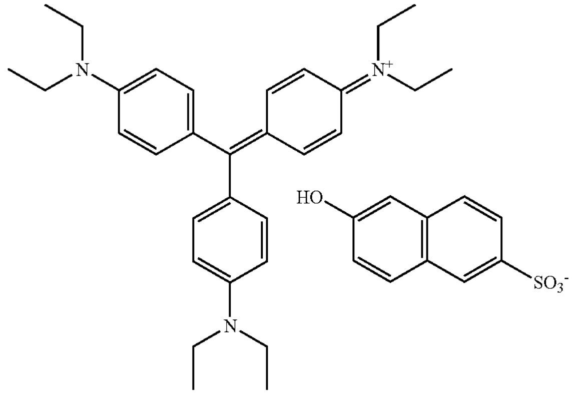

D-7

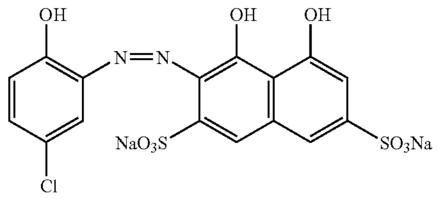

The amount of the specific dye used in the photosensitive composition of the present invention is preferably 0.5 to 5% by mass with respect to non-volatile components of the entire composition, and more preferably 1 to 3% by mass with respect to the same.

<(A) Compound Which Generates Radical Upon Being Heated or Exposed to Light (Radical Generator)>

A compound which generates a radical upon being heated or exposed to light (hereinafter, sometimes referred to as "radical generator") in the present invention can be any compound that generates a radical upon being heated or exposed to light.

Examples of the radical generators include organic boron salts, trihaloalkyl-substituted compounds (e.g., trihaloalkyl-substituted nitrogen-containing heterocyclic compounds, such as s-triazine compounds and oxadiazole derivatives; and trihaloalkylsulfonyl compounds), hexaarylbisimidazole, titanocene compounds, ketooxime compounds, thio compounds, and organic peroxide compounds.

Among these, organic boron salts and trihaloalkyl-substituted compounds are preferable in the present invention. A combination of organic boron salts and trihaloalkyl-substituted compounds is further preferable.

An organic boron anion constituting the organic boron salt is represented by the following Formula (1).

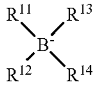

(1)

where $R^{11}$, $R^{12}$, $R^{13}$, and $R^{14}$, which may be the same as or different from each other, each represent an alkyl group, aryl group, aralkyl group, alkenyl group, alkynyl group, cycloalkyl group or heterocyclic group. It is particularly preferable where one of $R^{11}$, $R^{12}$, $R^{13}$, and $R^{14}$ is an alkyl group and the rest of them are aryl groups.

The organic boron anion is present simultaneously with a cation that is to be combined with the organic boron anion to form a salt. Examples of such cations include alkali metal ions, onium ions, and cationic sensitizing dyes.

Examples of the onium ions include ammonium ions, sulfonium ions, iodonium ions, and phosphonium ions.

When a salt of an organic boron anion and alkali metal ion or a salt of an organic boron anion and an onium ion is used as the organic boron salt, a sensitizing dye (i.e., infrared absorbent (D) in the present invention) is added thereto in order to impart photosensitivity to a range of wavelength of light that will be absorbed by the dye. When a salt whose organic boron anion is the counter ion of a cationic sensitizing dye is used as the organic boron salt, photosensitivity will be imparted thereto in accordance with the absorption wavelength of the cationic sensitizing dye. In the latter case, it is desirable to have a salt of an alkali metal ion and an organic boron anion or a salt of an onium ion and an organic boron anion included therein.

An example of the organic boron salts used in the present invention is a salt that includes the organic boron anion represented by general formula (1). A cation to form the salt is preferably an alkali metal ion or an onium ion. A salt of organic boron anion and an onium ion is especially preferred. Specific examples of such salts include ammonium salts such as tetraalkylammonium salts, sulfonium salts such as triarylsulfonium salts, and phosphonium salts such as triarylalkylphosphonium salts.

Specific examples (BC-1) to (BC6) of the particularly desirable organic boron salts are given below.

(BC-1)

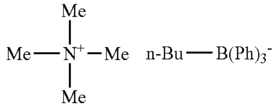

(BC-2)

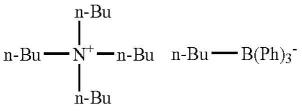

(BC-3)

n-Bu—P(Ph)$_3^+$ n-Bu—B(Ph)$_3^-$ (BC-4)

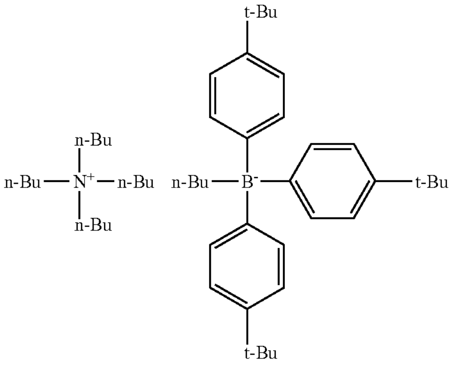

(BC-5)

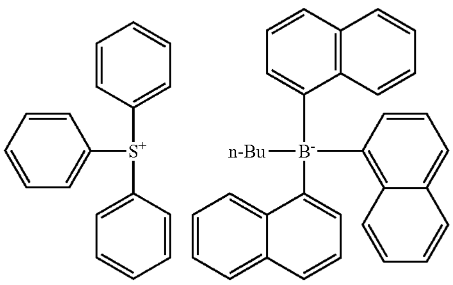

(BC-6)

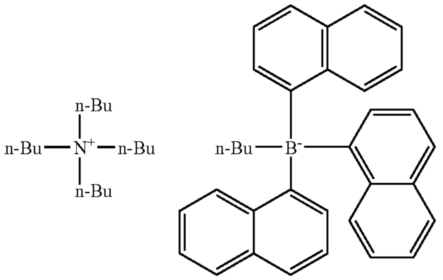

Other desirable examples of radical generator of the present invention include trihaloalkyl-substituted compounds. Specifically, trihaloalkyl-substituted compound is a compound that has in the molecule thereof at least one trihaloalkyl group such as a trichloromethyl or tribromomethyl group. Desirable examples of trihaloalkyl-substituted compounds include s-triazine derivatives and oxadiazole derivatives, both of which have the above-mentioned trihaloalkyl group bonded to a nitrogen-containing heterocyclic group; and trihaloalkylsulfonyl compounds, which has the above-mentioned trihaloalkyl group bonded, via a sulfonyl group, to an aromatic ring or to a nitrogen-containing heterocyclic ring.

Particularly desirable specific examples (T-1) to (T-15) of the compounds that have a trihaloalkyl group bonded to a nitrogen-containing heterocyclic group, and particularly desirable specific examples (BS-1) to (BS-10) of the trihaloalkylsulfonyl compounds are given below.

T-1

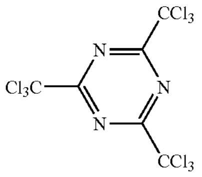

T-2

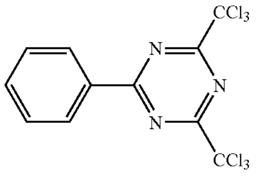

T-3

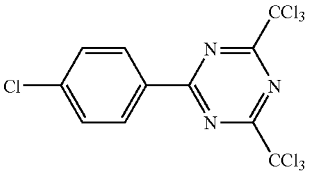

T-4

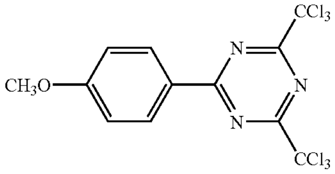

T-5

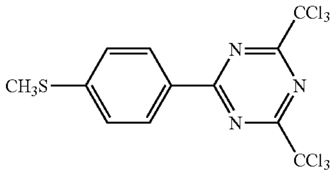

T-6

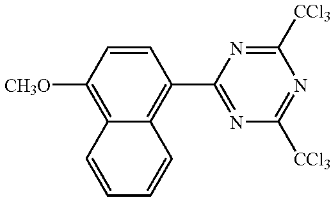

T-7

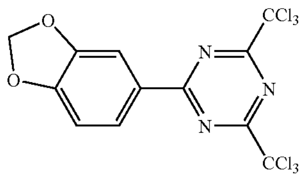

T-8

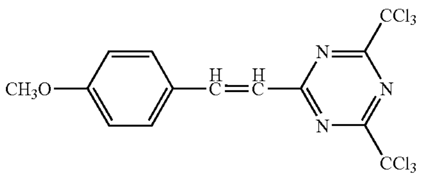

-continued

T-9

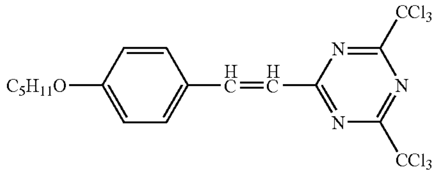

T-10

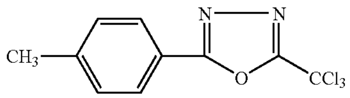

T-11

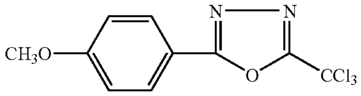

T-12

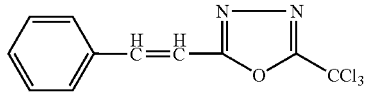

T-13

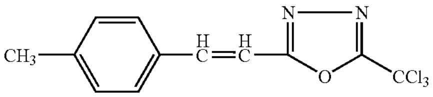

T-14

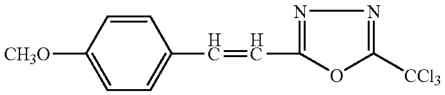

T-15

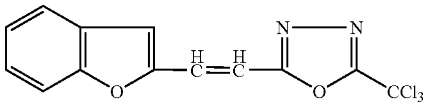

(BS-1)

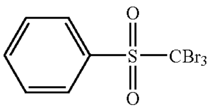

(BS-2)

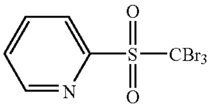

(BS-3)

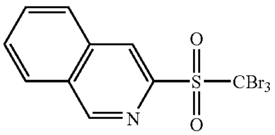

(BS-4)

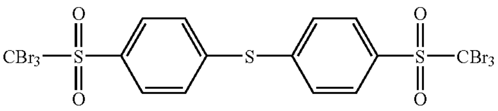

(BS-5)

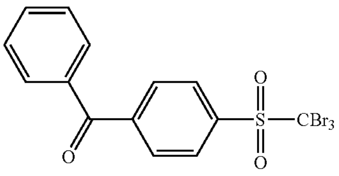

-continued (BS-6)

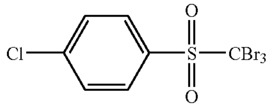

(BS-7)

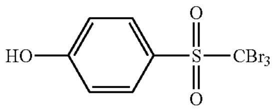

(BS-8)

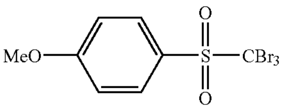

(BS-9)

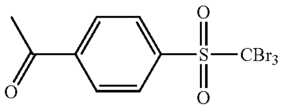

(BS-10)

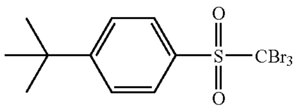

Other desirable examples of radical generator of the present invention include organic peroxides, specific examples of which include cumenehydroperoxide, tert-butylhydroperoxide, dichloroperoxide, di-tert-butylperoxide, benzoylperoxide, acetylperoxide, lauroylperoxide, and compounds having a structure given below.

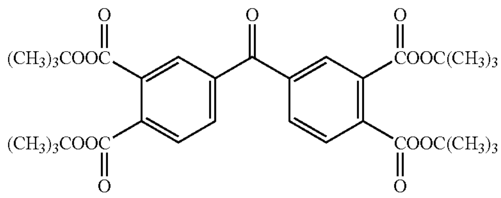

The radical generator is preferably added in an amount of between 1 and 100% by mass, and more preferably between 1 and 40% by mass, relative to the polymer (B) having on a side chain thereof a phenyl group substituted by a vinyl group.

<(B) Polymer Having on Side Chain Thereof Phenyl Group Substituted by Vinyl Group (Binder Polymer)>

A polymer (B) having on a side chain thereof a phenyl group substituted by a vinyl group (hereinafter, sometimes referred to as "specific polymer"), that is, a polymer having a phenyl group substituted by a vinyl group bonded to a main chain directly or indirectly via a linking group, is used as the binder polymer in the present invention. Any group, any atom, or any combinations thereof can be used as a linking group. The phenyl group may also be substituted by substitutable groups or atoms other than a vinyl group. Specific examples of introducible substituent groups or atoms include halogen atoms, and carboxyl groups, sulfo groups, nitro groups, cyano groups, amide groups, amino groups, alkyl groups, aryl groups, alkoxy groups, and aryloxy groups.

The vinyl group may be substituted by a halogen atom, a carboxyl group, sulfo group, nitro group, cyano group, amide group, amino group, alkyl group, aryl group, alkoxy group, aryloxy group or the like.

The above-mentioned polymer having on a side chain thereof a phenyl group substituted by a vinyl group is, in particular, a polymer which has on a side chain thereof the group represented by the following Formula (2).

(2)

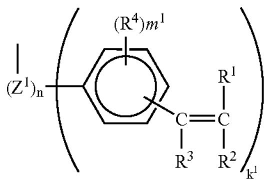

Where $Z^1$ represents a linking group. $R^1$, $R^2$ and $R^3$, each independently represent a hydrogen atom, halogen atom, carboxyl group, sulfo group, nitro group, cyano group, amide group, amino group, alkyl group, aryl group, alkoxy group, aryloxy group or the like. These groups may be substituted by an alkyl group, amino group, aryl group, alkenyl group, carboxyl group, sulfo group and hydroxy group. $R^4$ represents a substitutable group or atom. n represents an integer of 0 or 1. $m^1$ represents an integer of 0 to 4. $k^1$ represents an integer of 1 to 4.

The group represented by formula (2) will be explained in detail below. Examples of linking groups represented by $Z^1$ include an oxygen atom, sulfur atom, alkylene group, alkenylene group, arylene group, $—N(R^5)—$, $—C(O)—O—$, $—C(R^6)=N—$, $—C(O)—$, sulfonyl group, a group given below, and a group having a heterocyclic structure. These groups may be used alone or in combinations of two or more. $R^5$ and $R^6$ each independently represent a hydrogen atom, alkyl group, aryl group or the like. The above-listed linking groups may have a substituent such as an alkyl group, aryl group, or halogen atom.

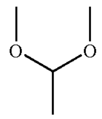

Examples of heterocyclic structures constituting the linking group represented by $Z^1$ include nitrogen-containing heterocycles such as pyrrole, pyrazole, imidazole, triazole, tetrazole, isooxazole, oxazole, oxadiazole, isothiazole, thiazole, thiadiazole, thiatriazole, indole, indazole, benzimidazole, benzotriazole, benzoxazole, benzthiazole, benzselenazole, benzthiazodiazole, pyridine, piridazine, pyrimidine, pyrazine, triazine, quinoline, and quinoxaline rings; a furan ring; and a thiophene ring. These heterocyclic structures may have a substituent such as an alkyl group, amino group, aryl group, alkenyl group, carboxyl group, sulfo group or hydroxyl group.

Examples of substitutable groups or atoms represented by $R^4$ include a halogen atom, and a carboxyl, sulfo, nitro, cyano, amide, amino, alkyl, aryl, alkoxy, and aryloxy groups. These groups or atoms may have a substituent such as an alkyl group, amino group, aryl group, alkenyl group, carboxyl group, sulfo group or hydroxyl group.

Specific examples (K-1 to K-20) of the group represented by formula (2) are illustrated below, but are not limited thereto.

(K-1)

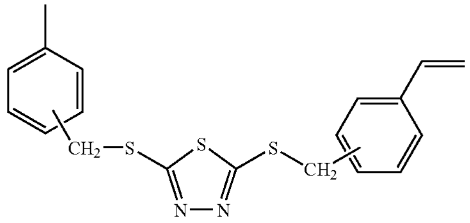

(K-2)

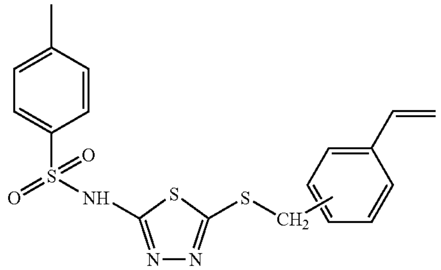

(K-3)

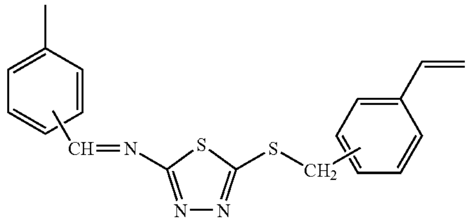

(K-4)

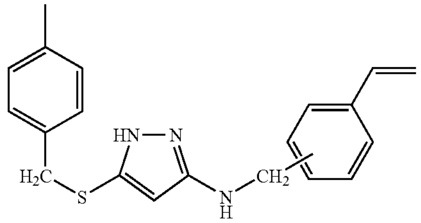

(K-5)

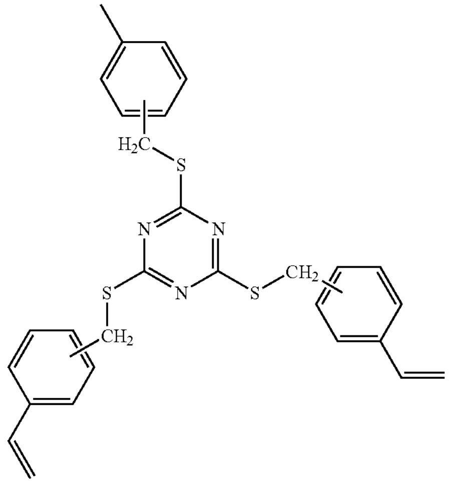

-continued (K-6)

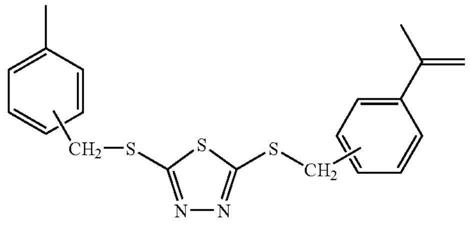

(K-7)

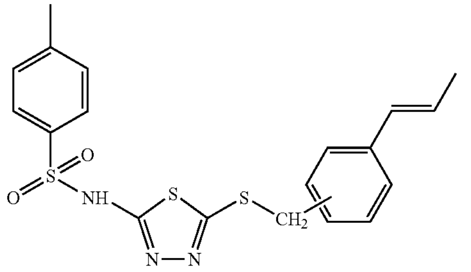

(K-8)

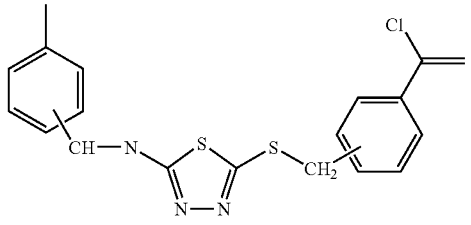

(K-9)

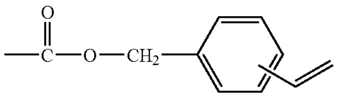

(K-10)

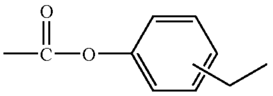

(K-11)

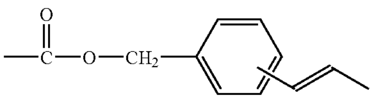

(K-12)

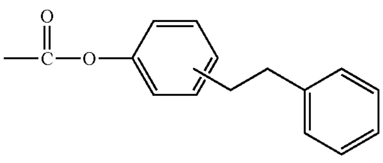

(K-13)

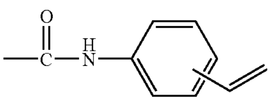

(K-14)

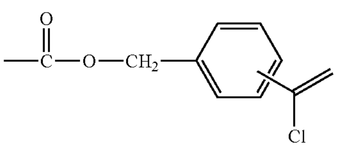

(K-15)

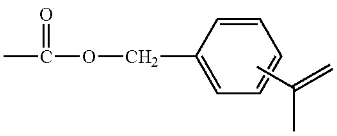

-continued (K-16)

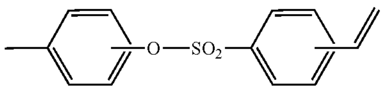

(K-17)

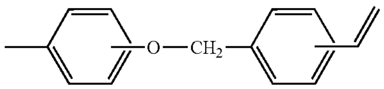

(K-18)

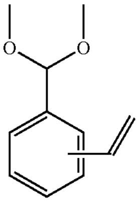

(K-19)

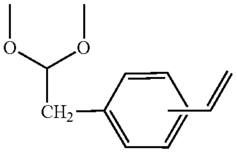

(K-20)

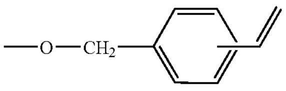

Among those represented by formula (2), the groups having a structure given below are particularly desirable. Namely, the groups with $R^1$ and $R^2$ being a hydrogen atom, and $R^3$ being a hydrogen atom or a lower alkyl group having 4 or less carbon atoms (e.g., a methyl group or an ethyl group) are desirable. Desirable linking groups represented by $Z^1$ have a heterocyclic structure with $k^1$ being an integer of 1 or 2.

In desirable aspects of the present invention, the specific polymers are soluble in aqueous alkaline solution. It is thus particularly desirable that the specific polymer of the present invention is a copolymer that has as a copolymerizable component a carboxyl group-containing monomer in addition to a monomer having a phenyl group substituted by a vinyl group (in particular, the groups represented by formula (2)).

The amount of the monomer having a phenyl group substituted by a vinyl group (i.e., the group represented by general formula (2)) in the copolymer composition is preferably between 1 to 95% by mass, more preferably between 10 to 80% by mass, and even more preferably between 20 to 70% by mass, relative to the total mass of the composition. Less than 1% by mass is undesirable in terms of sufficient effect of the monomer, while more than 95% by mass is undesirable in terms of solubility of the copolymer in an alkali aqueous solution.

The amount of the carboxyl group-containing monomer in the copolymer is preferably between 5 and 99% by mass. Less than 5% by mass may result in insolubility of the copolymer in an alkali aqueous solution.

Examples of carboxyl group-containing monomers used as a copolymerizable component include acrylic acid, methacrylic acid, 2-carboxylethyl acrylate, 2-carboxylethyl methacrylate, crotonic acid, maleic acid, fumaric acid, monoalkyl maleate, monoalkyl fumarate, and 4-carboxylstyrene.

Examples of copolymerizable components constituting the specific compolymers include polyacetal having on a side chain thereof benzoic acid, and polyvinyl alcohol modified with carboxylbenzaldehyde.

The polymer having on a side chain thereof a phenyl group substituted by a vinyl group of the present invention may also be a multi-component copolymer with monomer components other than a monomer having a carboxyl group introduced into the copolymer. Examples of monomers that can be introduced into the copolymer include: styrene, and styrene derivatives, such as 4-methylstyrene, 4-hydroxylstyrene, 4-acetoxystyrene, 4-carboxylstyrene, 4-aminostyrene, chloromethylstyrene, and 4-methoxystyrene; alkyl methacrylates, such as methyl methacrylate, ethyl methacrylate, butyl methacrylate, hexyl methacrylate, 2-ethylhexyl methacrylate, cyclohexyl methacrylate, and dodecyl methacrylate; aryl methacrylates or alkylaryl methacrylates, such as phenyl methacrylate and benzyl methacrylate; methacrylates having an alkyleneoxy group, such as 2-hydroxylethyl methacrylate, 2-hydroxylpropyl methacrylate, methacrylic acid monoester of methoxydiethylene glycol, methacrylic acid monoester of methoxypolyethylene glycol, and methacrylic acid monoester of polypropylene glycol; methacrylates having an amino group, such as 2-dimethylaminoethyl methacrylate, and 2-diethylaminoethyl methacrylate; acrylates corresponding to these methacrylates; monomers having a phosphoric acid group, such as vinyl phosphonate; monomers having an amino group, such as allylamine and diallylamine; monomers having a sulfonic acid group, such as vinylsulfonic acid and salts thereof, allylsulfonic acid and salts thereof, methacrylsulfonic acid and salts thereof, styrenesulfonic acid and salts thereof, and 2acrylamide-2-methylpropanesulfonic acid and salts thereof; monomers having a nitrogen-containing heterocycle, such as 4-vinylpyridine, 2-vinylpyridine, N-vinylimidazole and N-vinylcarbazole; monomers having a quaternary ammonium salt group, such as 4-vinylbenzyltrimethylammonium chloride, acryloyloxyethyltrimethylammonium chloride, methacryloyloxyethyltrimethylammonium chloride, a quaternary compound of dimethylaminopropylacrylamide by action of methyl chloride, a quaternary compound of N-vinylimidazole by action of methyl chloride, and 4-vinylbenzylpyridium chloride; acrylamide, methacrylamide, and acrylamide and methacrylamide derivatives, such as dimethylacrylamide, diethylacrylamide, N-isopropylacryamide, diacetoneacrylamide, N-methylolacrylamide, N-methoxyethylacrylamide, and 4-hydroxyphenylacrylamide; vinyl esters, such as acrylonitrile, methacrylonitrile, vinyl acetate, vinyl chloroacetate, vinyl propionate, vinyl butyrate, vinyl stearate, and vinyl benzoate; vinyl ethers, such as methyl vinyl ether and butyl vinyl ether; and other monomers, such as phenylmaleimide, hydroxyphenylmaleimide, N-vinylpyrrolidone, acryloylmorpholine, tetrahydrofurfuryl methacrylate, vinyl chloride, vinylidene chloride, allyl alcohol, vinyltrimethoxysilane, and glycidyl methacrylate.

The proportion of these monomers in a copolymer is not particularly limited, provided that a monomer having the group represented by formula (2) and a carboxyl group-containing monomer are kept in desirable proportions in the above-described copolymer composition.

The molecular weight of the above-described polymers should be in a desirable range, which is 1000 to 1000000, and more desirably 10000 to 300000.

Examples of polymers having on a side chain thereof the group represented by general formula (2) relating to the present invention are given below. Numerical values in the structural formulae represent percentage by mass of each repeating unit in the copolymers relative to the total mass of the copolymer composition.

(P-1)

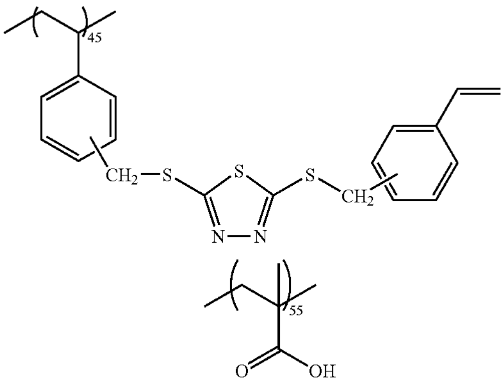

(P-2)

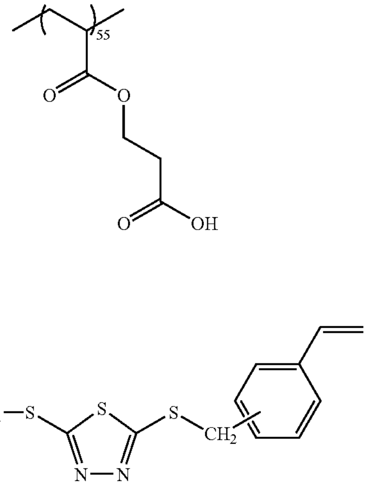

(P-3)

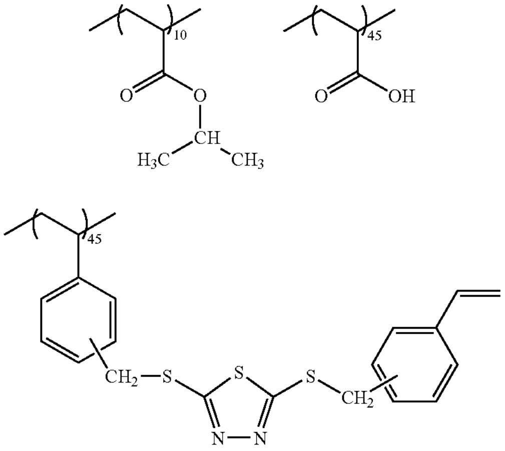

(P-4)

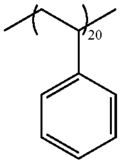

-continued
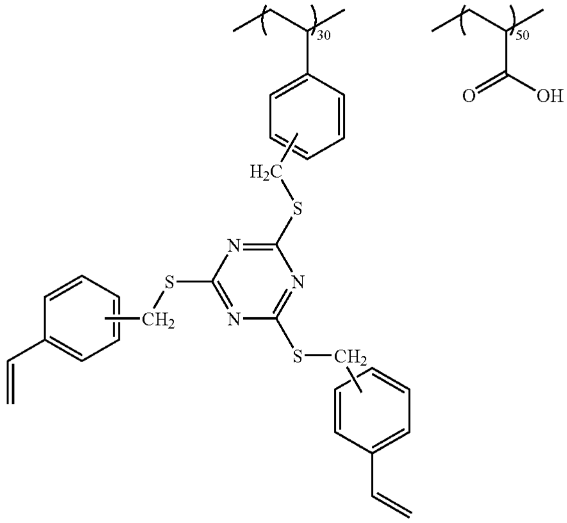
(P-5)
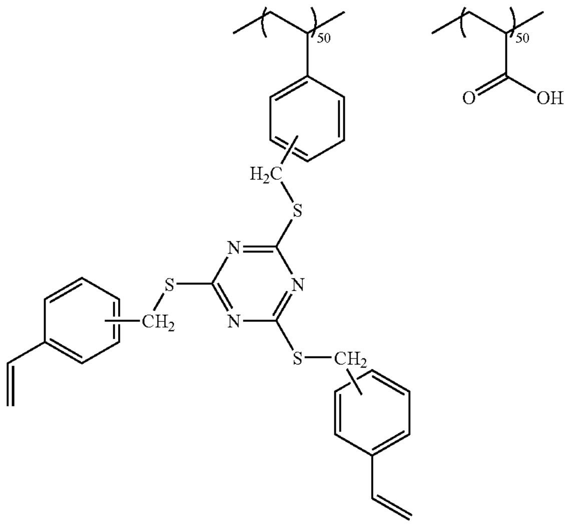
(P-6)
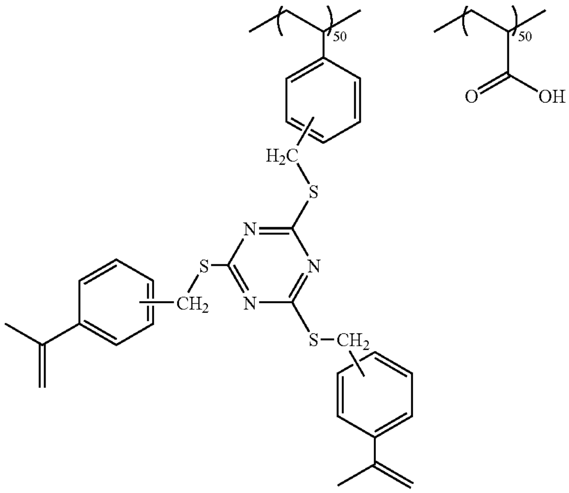
-continued
(P-7)
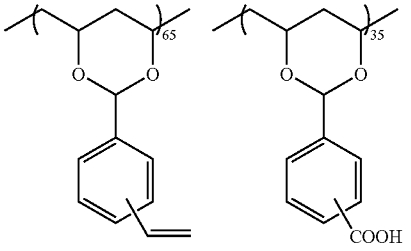
(P-8)
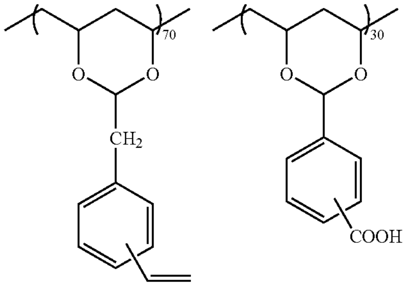
(P-9)
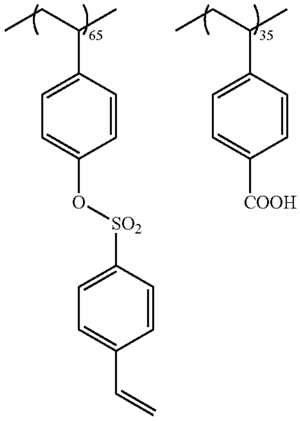
(P-10)
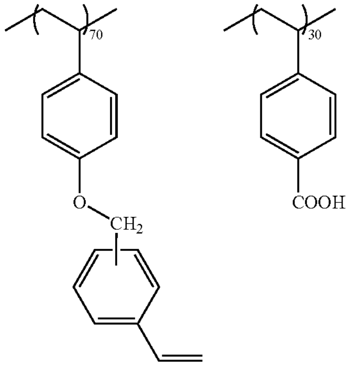

-continued (P-11)

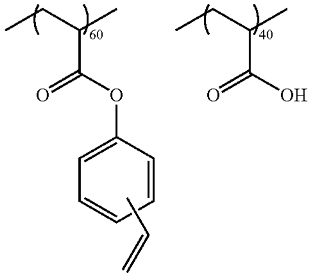

(P-12)

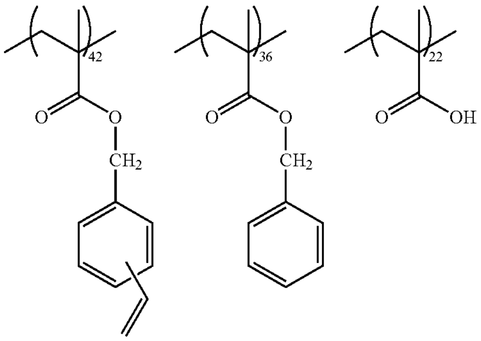

(P-13)

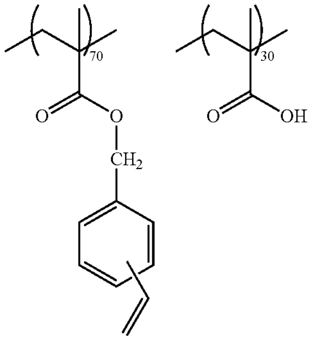

The specific polymer (B) used as a binder polymer in the present invention may be used alone or in combinations of two or more.

The binder polymers are added within a range of between 10 and 90% by mass, preferably between 20 and 80% by mass, of the total solids of the photosensitive composition from the standpoints of intensity of image portions (i.e., film properties, film strength) and image formability.

In the present invention, the specific polymer (B) may also be mixed with conventionally known other binder polymers, provided that the effects of the polymer (B) remain intact.

<(C) Monomer Having at Least Two Phenyl Groups Each Substituted by Vinyl Group (Polymerizable Compound)>

In the present invention, the monomer (C) having at least two phenyl groups each substituted by a vinyl group (hereinafter, referred to as "specific monomer") used as a polymerizable compound may be used to form a photosensitive layer with high photosensitivity that requires no heat processing, because styryl radicals, produced from radicals that are generated with the use of the above-described radical generator (A), are recombined to each other, causing effective crosslinking.

The specific monomer in the present invention typically is the compound represented by formula (3) below.

(3)

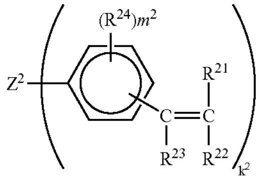

Where $Z^2$ represents a linking group. $R^{21}$, $R^{22}$ and $R^{23}$, each independently represent a hydrogen atom, halogen atom, carboxyl group, sulfo group, nitro group, cyano group, amide group, amino group, alkyl group, aryl group, alkoxy group, aryloxy group or the like. These groups may be substituted by an alkyl group, amino group, aryl group, alkenyl group, carboxyl group, sulfo group, hydroxy group, or the like. $R^{24}$ represents a substitutable group or atom. $m^2$ represents an integer of 0 to 4. $k^2$ represents an integer of 2 or greater.

The group represented by formula (3) will be explained in detail below. Examples of linking groups represented by $Z^2$ include an oxygen atom, sulfur atom, alkylene group, alkenylene group, arylene group, —N($R^5$)—, —C(O)—O—, —C($R^6$)=N—, —C(O)—, sulfonyl group, a group having a heterocyclic structure, a group having a benzene ring structure, and the like. These groups may be used alone or in combinations of two or more. $R^5$ and $R^6$ each independently represent a hydrogen atom, alkyl group, aryl group or the like. The above-listed linking groups may have a substituent such as an alkyl group, aryl group, or halogen atom.

Examples of heterocyclic structures constituting the linking group represented by $Z^2$ include nitrogen-containing heterocycles such as pyrrole, pyrazole, imidazole, triazole, tetrazole, isooxazole, oxazole, oxadiazole, isothiazole, thiazole, thiadiazole, thiatriazole, indole, indazole, benzimidazole, benzotriazole, benzoxazole, benzthiazole, benzselenazole, benzthiazodiazole, pyridine, piridazine, pyrimidine, pyrazine, triazine, quinoline, and quinoxaline rings; a furan ring; and a thiophene ring. These heterocyclic structures may have a substituent such as an alkyl group, amino group, aryl group, alkenyl group, carboxyl group, sulfo group or hydroxyl group.

Examples of substitutable groups or atoms represented by $R^{24}$ include a halogen atom, and a carboxyl, sulfo, nitro, cyano, amide, amino, alkyl, aryl, alkoxy, and aryloxy groups. These groups or atoms may have a substituent such as an alkyl group, amino group, aryl group, alkenyl group, carboxyl group, sulfo group or hydroxyl group.

Among those represented by formula (3), the groups having a structure given below are particularly desirable. Namely, the groups with $R^{21}$ and $R^{22}$ being a hydrogen atom, $R^{23}$ being a hydrogen atom or a lower alkyl group having 4 or less carbon atoms (e.g., a methyl group or an ethyl group), and $K^2$ being an integer of 2 or 10 are desirable.

Specific examples (C-1 to C-11) of the group represented by general formula (3) are illustrated below, but are not limited thereto.

(C-1)
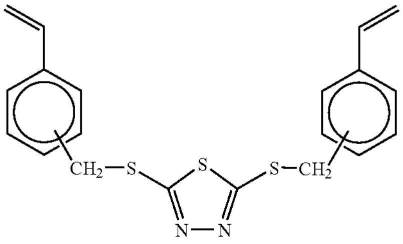
(C-2)
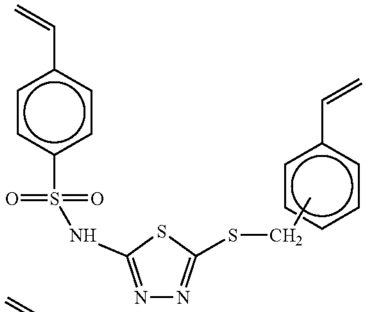
(C-3)
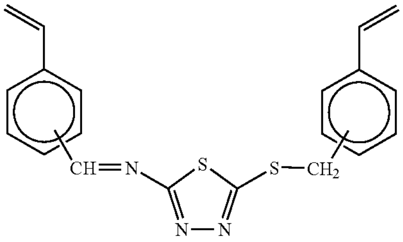
(C-4)
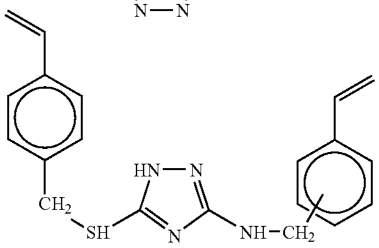
(C-5)
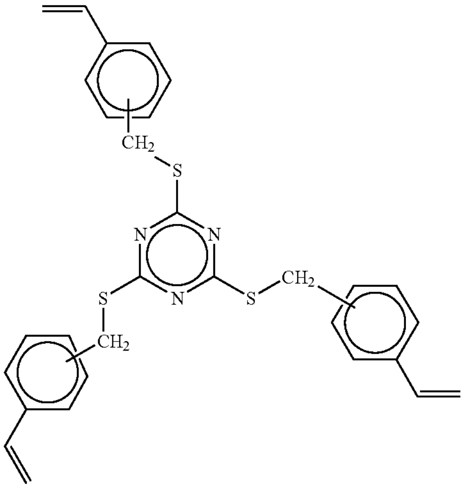
(C-6)
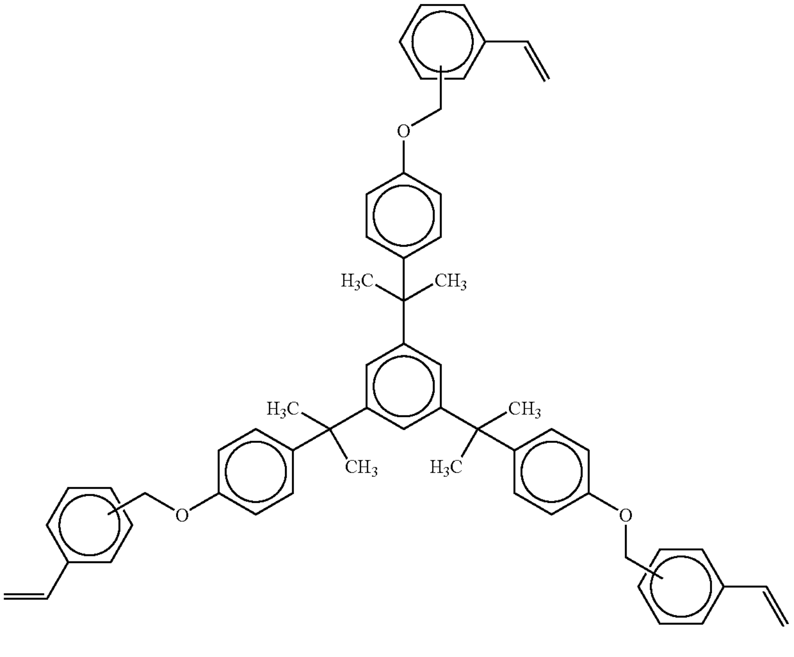

-continued
(C-7)
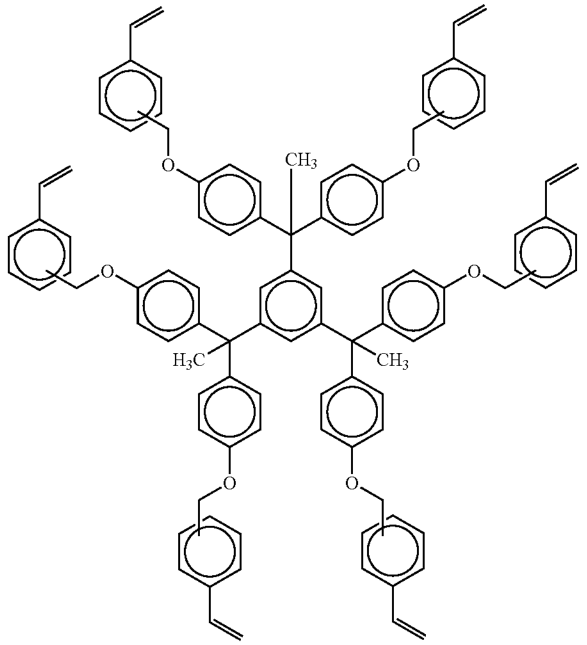
(C-8)
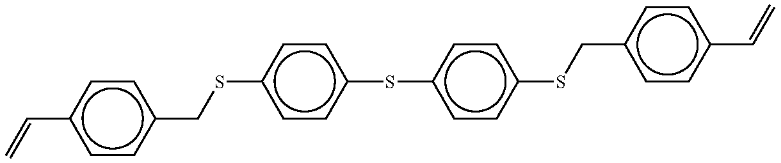
(C-9)
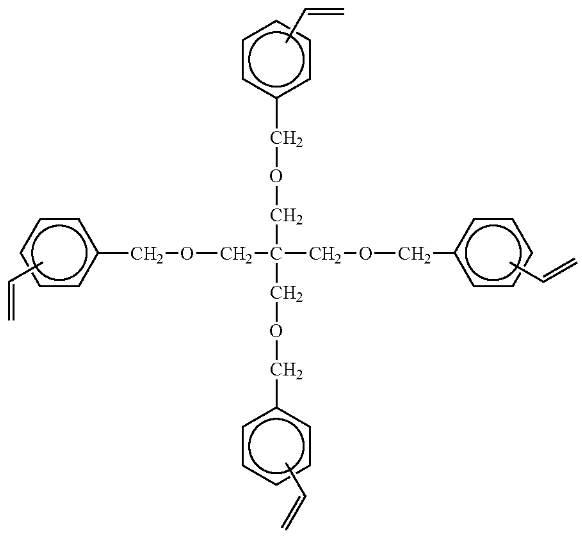
(C-10)
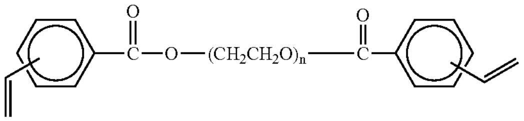
n = 1~50
(C-11)
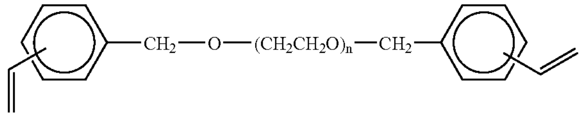
n = 1~50

The specific monomer (C) used as a polymerizable comound in the present invention may be used alone or in combinations of two or more.

The specific monomers are added within a range of between 0.01 and 10% by mass, preferably between 0.05 and 1% by mass, per 1 part by mass of the above-described polymer (B) having on a side chain thereof a phenyl group substituted by a vinyl group (i.e., the binder polymer).

In the present invention, the specific monomer (C) may also be mixed with conventionally known other polymerizable compounds, provided that the effects of the monomer (C) remain intact.

<(D) Infrared Absorbent >

The infrared absorbent used in the present invention has functions of converting absorbed infrared rays to heat, and generating excited electrons. Upon absorption of heat by the infrared absorbent, the above-described radical generators become decomposed to generate radicals.

The infrared absorbent used in the present invention has absorption maximum wavelength that is longer than 700 nm, and is desirably a dye or pigment having absorption maximum wavelength in a range from 760 to 1200 nm.

Commercially available and well-known dyes given in documents such as *Senryo Binran [Dye Manual]* (ed. Yuki Gosei Kagaku Kyokai (1970 ed.)) can be used. Specific examples include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate complexes.

Examples of desirable dyes include the cyanine dyes given in JP-A No. 58-125246, No. 59-84356, No. 59-202829, and No. 60-78787, the methine dyes given in JP-A No. 58-173696, No. 58-181690, and No. 58-194595, the naphthoquinone dyes given in JP-A No. 58-112793, No. 58-224793, No. 59-48187, No. 59-73996, No. 60-52940, and No. 60-63744, the squarylium dyes given in JP-A No. 58-112792, and the cyanine dyes given in UK Patent 434, 875.

The infrared absorbing sensitizer noted in U.S. Pat. No. 5,156,938 is also suitable for use as a dye. Particularly desirable for use are the substituted arylbenzo(thio)pyrylium salts in U.S. Pat. No. 3,881,924, the trimethine thiapyrylium salts in JP-A No. 57-142645 (U.S. Pat. No. 4,327,169), the pyrylium compounds in JP-A No. 58-181051, No. 58-220143, No. 59-41363, No. 59-84248, No. 59-84249, No. 59-146063, and No. 59-146061, the cyanine dyes in JP-A No. 59-216146, the pentamethine thiopyrylium salts and the like in U.S. Pat. No. 4,283,475 or the pyrylium compounds disclosed in Japanese Patent Application Publication (JP-B) No. 5-13514 and No. 5-19702. Other particularly desirable examples of dyes include the near infrared absorbing dyes given under Formulas I and II in U.S. Pat. No. 4,756,993.

Specific examples (S-1 to S-14) of the dyes preferably used as infrared absorbent are illustrated below, but are not limited thereto.

(S-1)

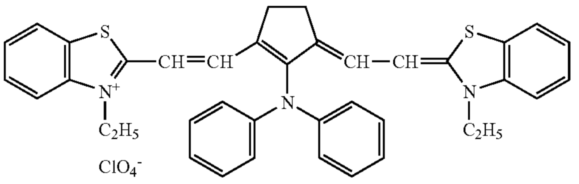

(S-2)

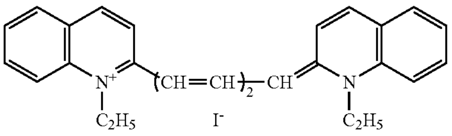

(S-3)

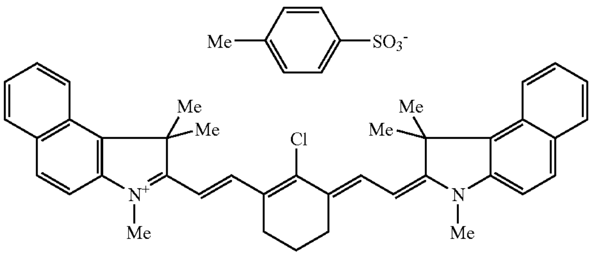

(S-4)

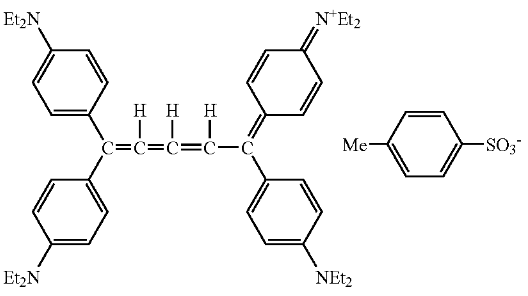

(S-5)

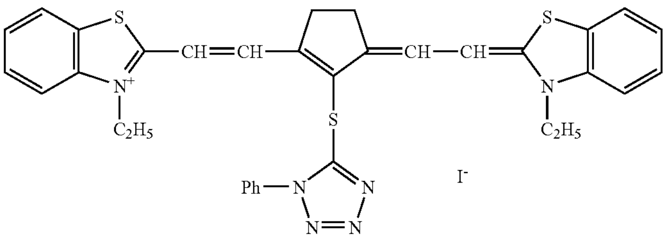

-continued
(S-6)
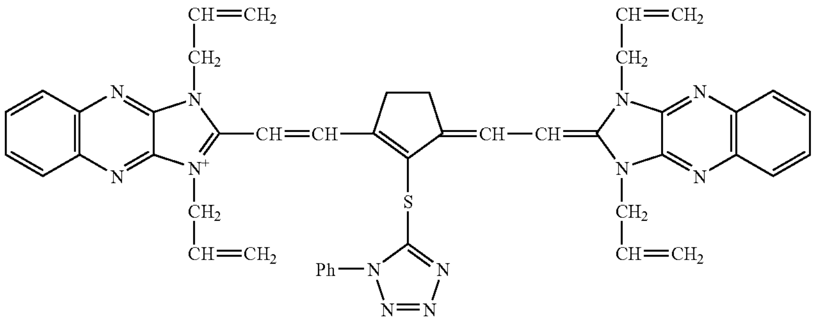
(S-7)
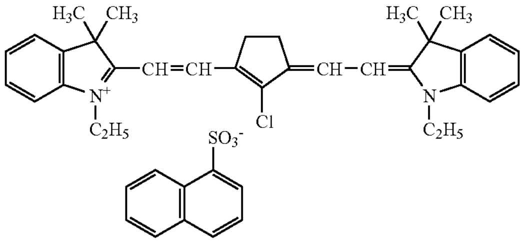
(S-8)
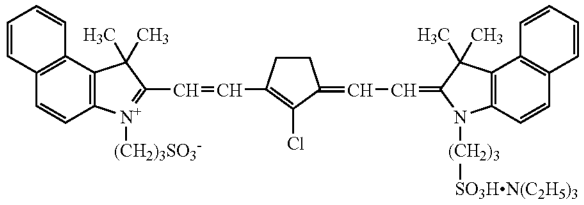
(S-9)
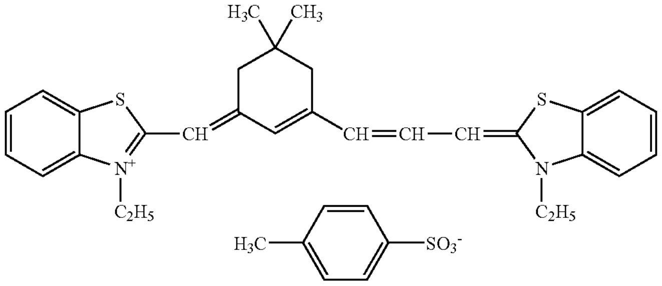
(S-10)
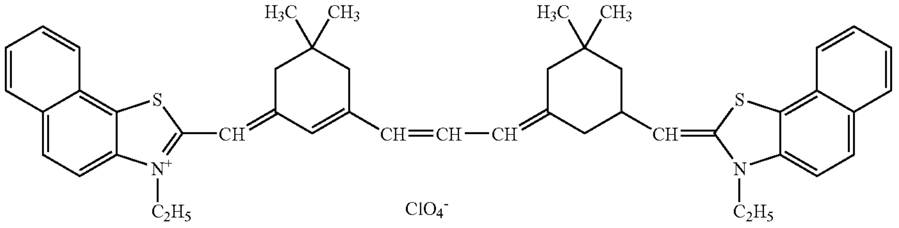
(S-11)
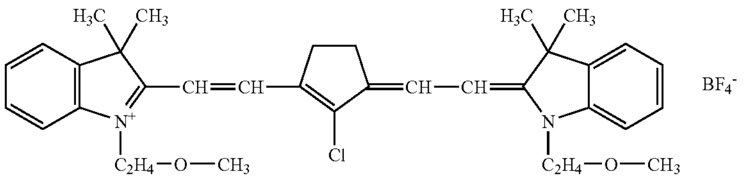
(S-12)
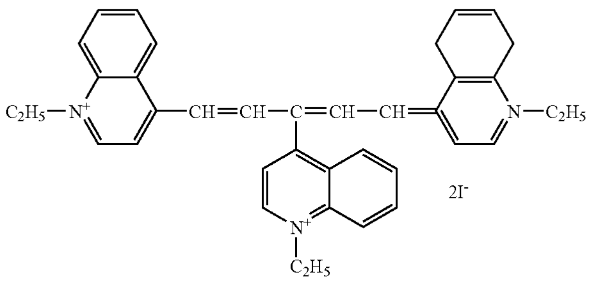
(S-13)
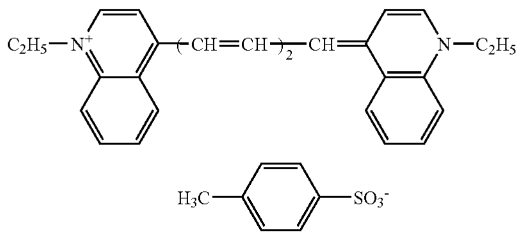

-continued (S-14)

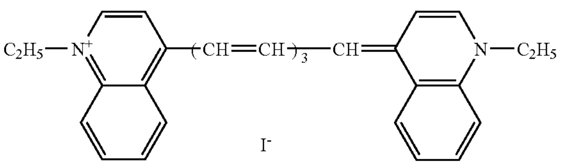

Infrared absorbents made by having a counter anion of the above-listed infrared absorbent (i.e., cationic sensitizing dye) substituted by an organic boron anion as described above may also be used.

These dyes may be used alone or in combinations of two or more.

When these dyes are used in an image recording material as an infrared absorbent, the amount of the dyes is preferably 3 to 300 mg per 1 $m^2$ of a photosensitive layer, and more preferably 10 to 200 mg per 1 $m^2$ of the same.

Examples of pigments used in the present invention include commercially available pigments and pigments listed in the Color Index (C.I.) Manual, *Saishin Ganryo Binran [Recent Pigments Manual]* (ed. by Nihon Ganryo Gijutsu Kyokai (1977)), *Saishin Ganryo Oyo Gijutsu [Recent Pigment Applications and Techniques]* (published by CMC (1986 ed.)), and *Insatsu Inki Gijutsu [Printing Ink Techniques]* (published by CMC (1984)).

Types of pigments include black pigments, yellow pigments, orange pigments, brown pigments, red pigments, violet pigments, blue pigments, green pigments, fluorescent pigments, metallic powder pigments, and other polymer bonded dyes. Specific examples which can be used include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, printing lake pigments, azine pigments, nitroso pigments, nitro pigments, natural pigments, fluorescent pigments, inorganic pigments, and carbon black. Among these pigments, carbon black is preferably used.

These pigments can be used with or without surface treatment. Methods of surface treatment include methods for coating surfaces with resin or wax, methods for applying surfactants, and methods for allowing reactive substances (such as silane coupling agents, epoxy compounds, and polyisocyanates) to bond to the surface of the pigments. The aforementioned surface treatments are described in *Kinzoku Sekken no Seishitsu to Oyo [Metal Soap Properties and Applications]* (published by Koshobo), *Insatsu Inki Gijutsu [Printing Ink Techniques]* (published by CMC (1984)), and *Saishin Ganryo Oyo Gijutsu [Recent Pigment Applications and Techniques]* (published by CMC (1986 ed.)).

The pigment particle diameter preferably ranges between 0.01 and 10 μm, more preferably between 0.05 and 1 μm, and even more preferably between 0.1 and 1 μm. When the pigment particle diameter is in the above range, pigments can be stably dispersed in the photosensitive composition, providing a uniform photosensitive layer for an application of a planographic printing plate precursor.

Common dispersion techniques employed in the manufacture of ink, toner, and the like can be used to disperse the pigment. Examples of dispersion devices include ultrasonic dispersers, sand mills, attritors, pearl mills, super mills, ball mills, impellers, dispersers, KD mills, colloid mills, dynatrons, three-roll mills, and pressure kneaders. Details are available in *Saishin Ganryo Oyo Gijutsu [Recent Pigment Applications and Techniques]* (published by CMC (1986 ed.)).

The pigments may be added as infrared absorbent within a range of between 0.01 to 50% by mass, preferably between 0.1 to 10% by mass, of the total solids of the photosensitive composition from the standpoints of uniformity in the photosensitive composition, and durability when applied to a photosensitive layer.

Additionally, the photosensitive composition of the present invention may also include other components other than these essential components (A) to (E) which are appropriately selected in accordance with applications, methods of preparation, and the like. Examples of desirable other components will be illustrated below.

<Polymerization Inhibitor>

A small amount of a thermopolymerization inhibitor is preferably added to the photosensitive composition of the present invention during preparation or storage of the photosensitive composition in order to inhibit unnecessary thermopolymerization of a compound which has a polymerizable ethylenic unsaturated double bond, i.e., the specific monomer (C) (polymerizable compound). Examples of suitable thermopolymerization inhibitors include hydroquinone, p-methoxyphenol, di-tbutyl-p-cresol, pyrogallol, tbutylcatechol, benzoquinone, 4,4'-thiobis(3-methyl-6-t-butylphenol), 2,2'-methylenebis(4-methyl-6-t-butylphenol), and a cerium (III) salt of N-nitrosophenylhydroxyamine. The amount of the thermopolymerization inhibitor is preferably between approximately 0.01 to approximately 5% by mass of the total mass of nonvolatile components in the composition.

Higher fatty acid derivatives, such as behenic acid or behenic amide, and the like may be added as needed to prevent polymerization inhibition due to oxygen so that the derivative is uniformly distributed on the photosensitive layer surface during drying of a coating solution after being applied. The amount of the higher fatty acid derivative is preferably between approximately 0.5 to approximately 10% by mass of the total mass of nonvolatile components in the composition.

<Colorant>

Dyes or pigments may be added to the photosensitive composition of the present invention to color the same. When the photosensitive composition is applied to a planographic printing plate precursor, such colorants make what is referred to as plate-comparability (i.e., visibility or applicability to an image density measuring device) as a printing plate after plate-making improved. Desirable colorants include dyes and pigments. Specific examples thereof include pigments such as phthalocyanine pigments, azo pigments, carbon black and titanium oxide, and dyes such as ethyl violet, crystal violet, azo dyes, anthraquinone dyes and cyanine dyes. The amount of pigments and dyes as colorants is preferably between approximately 0.5 to approximately 5% by mass of the total mass of nonvolatile components in the composition. Desirable dyes do not include halogen ions as counter anions.

<Other Additives>

Other additives may be added in the photosensitive composition of the present invention by mixing with diluting solvents or the like in order to impart various properties to the photosensitive composition depending on purpose. Examples of other additives include oxygen removing agents such as phosphine, phosphonate, phosphite and the like, reducing agents, antifading agents, surfactants, plasticizers, antioxidants, ultraviolet ray absorbers, anti-fungus agents, antistatic agents, and the like.

Other known additives, such as inorganic fillers for improving physical properties of cured films, other plasticizers, and sensitizing agents for improving ink receptivity of photosensitive layer surfaces may also be added to the photosensitive composition of the present invention.

Examples of plasticizers include dioctyl phthalate, didodecyl phthalate, triethylene glycol dicaprate, dimethyl glycol phthalate, tricresyl phosphate, dioctyl adipate, dibutyl cebacate, and triacetylglycerin. The amount of the plasticizers in the photosensitive composition is generally 10% by mass or less, relative to the total mass of the specific polymer (B) (binder polymer) and the specific monomer (C).

Ultraviolet ray initiators, thermally crosslinking agents and the like may also be added in order to enhance the effects of exposing to light and heating after development, so that later-described film strength (i.e., printing durability) is improved.

Polymerization accelerators such as amine, thios and disulfide, chain transfer agents and the like may also be added in order to accelerate polymerization. Specific examples of polymerization accelerators and chain transfer agents include N-phenylglycine, triethanolamine and N,N-diethylaniline.

<Image Recording Material>

The image recording material of the present invention is characterized by a photosensitive layer which includes the photosensitive composition of the present invention and is disposed on a support. The image recording material of the present invention may be embodied as planographic printing plate precursors which allow images to be directly drawn using infrared laser and the like, photo-modeling materials with high photosensitivity, hologram materials which exploits alteration in the refractive index due to polymerization, electronic materials such as photoresists, and the like. Among these, planographic printing plate precursors are particularly desirable. The image recording material of the present invention will be described with reference to, but is not limited to, a planographic printing plate precursor.

A planographic printing plate precursor to which the present invention is applicable has, on a support, a photosensitive layer which includes a photosensitive composition of the present invention. The planographic printing plate precursor may also have other layers such as an intermediate layer and a protective layer as needed. Each component of the planographic printing plate precursor is described below.

<Photosensitive Layer>

The photosensitive layer of the present invention includes, as essential components, a compound (A) which generates a radical upon being heated or exposed to light; a polymer (B) having on a side chain thereof a phenyl group substituted by a vinyl group; a monomer (C) having in a molecule thereof at least two phenyl groups each substituted by a vinyl group; an infrared absorbent (D); and a dye (E) having absorption maximum wavelength in a range from 500 to 700 nm.

The photosensitive layer may be provided in a manner that the photosensitive composition of the present invention is solved in various organic solvents and then applied onto a later-described support or an intermediate layer. Examples of solvents used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate and ethyl lactate. These solvents may be used alone or mixed together. The concentration of the solid in a coating solution is suitably from 2 to 50% by mass.

The coating amount of the photosensitive layer has influences on sensitivity and developability of the photosensitive layer, and strength and printing durability of a layer to be exposed, and thus may be appropriately selected depending on the application. If the coating amount is too small, printing durability becomes insufficient, while if the coating amount is too large, sensitivity becomes low. Low sensitivity is undesirable in that exposure and development thereof take a longer time. The desirable coating amount of the photosensitive layer after drying, as a photosensitive planographic printing plate precursor for scanning exposure, which is a main object of the present invention, is between about 0.1 and 10 $g/m^2$, more desirably between 0.5 and 5 $g/m^2$, on the mass basis.

<Physical Properties of Photosensitive Layer>

The photosensitive layer of the present invention used in a photosensitive planographic printing plate precursor desirably has physical properties given below. The development rate at non-exposed portions with respect to alkali developers having a pH between 10 and 13.5 is preferably 80 nm/sec or greater. The permeation rate of alkali developers at exposed portions is preferably 100 nF/sec or smaller.

The development rate at non-exposed portions with respect to alkali developers having a pH between 10 and 13.5 herein is obtained by dividing a film thickness (nm) of the photosensitive layer by time (sec) required to develop the same. The permeation rate of alkali developers represents a rate at which electrostatic capacity (E) of the photosensitive layer changes when the photosensitive layer formed on a conductive support is immersed in the developer.

Methods of measuring "the development rate with respect to alkali developers" and "the permeation rate of alkali developers" in the present invention will be explained in detail below.

-Measurement of Development Rate with Respect to Alkali Developers-

The development rate with respect to alkali developers herein is obtained by dividing the film thickness (nm) of the photosensitive layer by time (sec) required to develop the same.

The measurement is conducted in the following manner. As shown in FIG. 1, an aluminum support having thereon a non-exposed photosensitive layer is immersed in an alkali developer (30° C.) having a pH between 10 and 13.5, and dissolution behaviors of the photosensitive layer is determined using a DRM interference potential measuring device. FIG. 1 schematically illustrates an example of such DRM interference potential measuring devices. In the present invention, the light having a wavelength of 640 nm was used to determine changes in film thickness on the basis of interference. In the case in which the development behavior is based on non-swelling development from a photosensitive layer surface, the film thickness gradually becomes thinner as the time for developing the same becomes longer. Interferential waves in accordance with the thickness are obtained. In the case of swelling development (film-released dissolution), the film thickness varies on the basis of permeation of the developer, resulting in unclear interferential waves.

Continuation of measurement under these conditions will give the time until the photosensitive layer is completely removed and thus the film thickness becomes zero (time to complete development (s)). The development rate can be obtained from this time and the film thickness (μm) of the photosensitive layer as shown in the equation below. Greater development rate indicates better developability with easy removal of the film using a developer.

Development rate (of non-exposed portions)=Photosensitive layer thickness (μm)/Time to complete development (sec)

-Measurement of the Permeation Rate of Alkali Developers-

The permeation rate of alkali developers represents a rate at which electrostatic capacity (E) of the photosensitive layer changes when the photosensitive layer formed on a conductive support is immersed in the developer.

Figure 2:
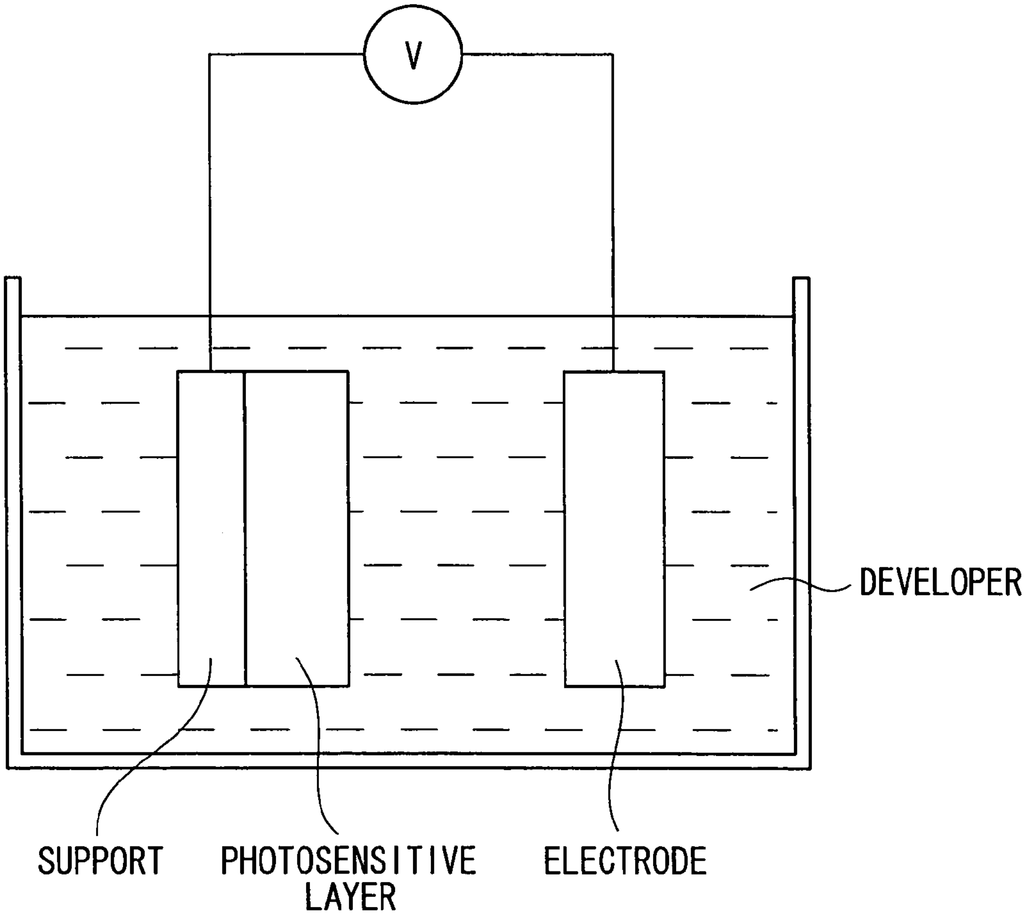
FIG. 2 is a schematic structural view illustrating an example of a method of measuring electrostatic capacity, the method being used for evaluating permeability of a developing liquid into a photosensitive layer.

The measurement of the electrostatic capacity, which is an index of the permeability of the developer in the present invention, is conducted in the following manner. As shown in FIG. 2, an aluminum support having thereon a non-exposed photosensitive layer which has been exposed to a predetermined amount of light and cured is immersed as one electrode in an alkali developer (28° C.) having a pH between 10 and 13.5. A conductive lead is connected to the aluminum support. An ordinary electrode is used as the other electrode. To this system, voltage is applied. With the lapse of time since voltage application, the developer penetrates the interface between the support and the photosensitive layer, making changes on the electrostatic capacity.

The developer permeation rate can be obtained from the time duration (s) before the electrostatic capacity becomes constant and a saturation value (nF) of the electrostatic capacity of the photosensitive layer as shown in the equation below. Smaller permeation rate indicates smaller permeation of the developer.

Developer permeation rate (of exposed portions)=Saturation value (nF) of the electrostatic capacity of the photosensitive layer/Time duration (s) before the electrostatic capacity becomes constant The photosensitive layer of the present invention used in a photosensitive planographic printing plate precursor desirably has physical properties given below. The development rate at non-exposed portions with respect to alkali developers having a pH between 10 and 13.5 is preferably 80 to 400 nm/sec. The permeation rate of such alkali developers into the photosensitive layer is preferably 90 nF/sec or smaller. More desirably, the development rate at non-exposed portions with respect to alkali developers having a pH between 10 and 13.5 in accordance with the above measurement is 90 to 200 nm/sec, and the permeation rate of such alkali developers into the photosensitive layer is 80 nF/sec or smaller. Although there are no limitations on the upper limit of the development rate or the lower limit of the permeation rate, the development rate at non-exposed portions is preferably in the range between 90 and 200 nm/sec, and the permeation rate of alkali developers into the photosensitive layer is preferably 80 nF/sec or smaller.

The development rate at non-exposed portions of the photosensitive layer and the permeation rate of alkali developers into a cured photosensitive layer can be controlled in conventional methods. Examples of methods for improving the development rate at non-exposed portions include addition of hydrophilic compounds to the photosensitive layer. Examples of methods for controlling the permeation rate of developers into exposed portions include addition of hydrophobic compounds to the photosensitive layer.

The development rate of the photosensitive layer and the permeation rate of the developer can be easily controlled within the above desirable range by adjusting the amount of each component constituting the photosensitive layer of the present invention. These rates are preferably set within the above ranges of physical properties.

<Support>

There are no limitations on supports for planographic printing plate precursors of the present invention and any known conventional hydrophilic supports for planographic printing plate precursors can be used.

The support is a dimensionally stable material in the form of a sheet, such as paper, paper laminated with plastic (such as polyethylene, polypropylene, and polystyrene), metal sheets (such as aluminum, zinc, and copper), plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or plastic films with metals such as the above laminated or deposited thereon. The surfaces of the support may be subjected to known appropriate physical or chemical treatments as needed for the purpose of imparting hydrophilicity, improving strength and the like.

Papers, polyester films or aluminum sheets are preferred as the support used in the present invention. Of these, relatively inexpensive aluminum sheets with good dimensional stability are especially preferred. Aluminum sheets may provide surfaces that are excellent in hydrophilicity and strength by being subjected to surface treatments as needed. Complex sheets formed by a polyethylene terephthalate and an aluminum sheet laminated thereon film given in JP-B No. 48-18327 are also preferred.

Aluminum sheets means dimensionally stable metal sheets whose main component is aluminum. Suitable aluminum sheets are pure aluminum sheets, alloy sheets comprising aluminum as the main component and minute amounts of other elements, as well as plastic films or paper with aluminum (alloy) laminated or deposited thereon. In the description hereinbelow, supports formed from these aluminum or aluminum alloys are generally called "aluminum support." Examples of different elements which can be incorporated in aluminum alloys include silicon, iron, manganese, copper, magnesium, chromium, zinc, bismuth, nickel, and titanium. The content of such different elements in alloys should be, at most, no more than 10% by mass. Although pure aluminum is especially desirable in the present invention, trace amounts of other elements may be included since it is technically difficult, in terms of refining, to produce entirely pure aluminum. The composition of aluminum sheets suitable for the present invention is not specified. Aluminum sheets of conventional well-known materials, such as JIS A 1050, JIS A 1100, JIS A 3103, JIS A 3005, are suitable for use.

The thickness of the aluminum support used in the present invention will vary depending on the size of printers, the size of printing plates and user preference, but is preferably between 0.25 and 0.55 mm. Thickness less than 0.25 mm is undesirable in terms of handling properties, such as prevention of crease forming on the support while being carried by hand. If the thickness is more than 0.55 mm, the mass of CTP plate becomes large, resulting in increased frequency of jamming happening in CTP exposure devices.

Aluminum supports may undergo later-described appropriate surface treatments as needed.

<Surface Roughening Treatment>

Examples of methods for the surface roughening treatment include mechanical surface roughening, chemical etching, and electrolytic graining methods disclosed in JP-A No. 56-28893. An electrochemical surface roughening method, in which surfaces are electrochemically roughened in a hydrochloric acid or nitric acid electrolyte is also used. Further, mechanical surface roughening methods such as wire brush graining wherein aluminum surfaces are scratched using metal wires, ball graining wherein aluminum surfaces are scratched with abrasive balls and other abrasives, and brush graining wherein surfaces are roughened with nylon brushes and abrasives. These surface-roughening methods may be used alone or in combination.

Among these methods, the electrochemical method which is to have surfaces to undergo chemical roughening in a hydrochloric or nitric acid electrolyte. In this method, suitable amount of electricity applied to the anode is in the range of 50 to 400 $C/dm^2$. In particular, surfaces are preferably subjected to an alternate- and/or direct-current electrolysis in an electrolyte containing 0.1 to 50% hydrochloric acid or nitric acid, at a temperature of 20 to 80° C., for a duration of 1 second to 30 minutes, and at an electric current density of 10 to 50 $A/dm^2$.

Aluminum supports which have undergone such surface roughening treatment may undergo chemical acid or alkali etching treatment. Suitable examples of etching agents include sodium hydroxide, sodium carbonate, sodium aluminate, sodium metasilicate, sodium phosphate, potassium hydroxide and lithium hydroxide. These etching agents are desirably used at a concentration between 1 to 50% and at a temperature between 20 and 100° C. After the etching, surfaces are washed with acid in order to remove smuts remaining thereon. Examples of acids used herein include nitric acid, sulfuric acid, phosphoric acid, chromic acid, hydrofluoric acid and borofluoric acid. Particularly preferable methods for removing smuts of the supports which have been undergone the electrochemical surface roughening treatment include a method of bringing the surface into contact with 15 to 65% by mass of sulfuric acid at a temperature between 50 and 90° C. as described in JP-A No. 53-12739, and a method of alkali etching as described in JP-B No. 48-28123. Methods and conditions are not particularly limited to the above examples, provided that the center line of the processed surface has a surface roughness Ra between 0.2 and 0.7 μm after the above-described treatments.

<Anodizing Treatment>

The aluminum support with an oxide layer formed thereon as described above is then subjected to an anodizing treatment.

In anodizing treatments, aqueous solutions of sulfuric acid, phosphoric acid, oxalic acid, and boric acid/sodium borate are used singly or in combinations as a main component of an electrolytic bath. The electrolyte solution may contain other components that are commonly found in at least Al alloy sheets, electrodes, tap water, underground water, and the like. Second and third components may also be included. Examples of second and third components herein include cations such as metal ions, e.g., Na, K, Mg, Li, Ca, Ti, Al, V, Cr, Mn, Fe, Co, Ni, Cu and Zn, ammonium ions, and anions such as nitrate, carbonate, chloride, phosphate, fluoride, sulfite, titanate, silicate and borate ions. These ions may be included at a concentration between 0 and 10000 ppm. Desirable conditions for anodizing treatment is as follows. The amount of anodic oxide film formed by the treatment is preferably between 0.5 and 10.0 $g/m^2$, and more preferably between 1.0 and 5.0 $g/M^2$. The concentration of the acid generally used as a main component of the electrolyte is between 30 and 500 g/L. The temperature of the treatment solution is between 10 and 70° C. The anodizing treatment is preferably conducted either by direct- or alternate-current electrolysis at an electric current density between 1 and 40 $A/m^2$.

Any known conventional methods may be used for making support surfaces hydrophilic. Especially desirable methods include making the support surface hydrophilic using silicate salt, polyvinyl phosphonic acid, and the like. The film is preferably formed at an amount of between 2 and 40 $mg/m^2$, and more preferably between 4 and 30 $mg/m^2$ as Si or P element. The coating amount may be determined through fluorescent X-ray analysis.

The above hydrophilizing treatment may be carried out, for example, by immersing, at a temperature between 15 and 80° C. for 0.5 to 120 seconds, an aluminum support having formed thereon an anodic oxide film in an aqueous solution containing an alkali metal silicate salt or polyvinyl phosphonic acid at a concentration between 1 and 30% and preferably between 2 and 15% by mass, and having a pH between 10 and 13 at 25° C.

Examples of alkali metal silicate salts used in the above hydrophilizing treatment include sodium silicate, potassium silicate and lithium silicate. Examples of hydroxides used for raising the pH of the aqueous alkali metal silicate salt solution include sodium hydroxide, potassium hydroxide and lithium hydroxide. Alkaline earth metal salts or Group IVB metal salts may be included in the treatment solution. Examples of alkaline earth metal salts include water-soluble salts such as nitric acid salts, e.g., calcium nitrate, strontium nitrate, magnesium nitrate and barium nitrate, sulfuric acid salts, hydrochloric acid salts, phosphate salts, acetate salts, oxalate salts and borate salts. Examples of Group IVB metal salts include titanium tetrachloride, titanium trichloride, titanium potassium fluoride, titanium potassium oxalate, titanium sulfate, titanium tetraiodide, zirconium oxychloride, zirconium dioxide, zirconium oxychloride and zirconium tetrachloride.

The alkaline earth metal or Group IVB metal salts may be used alone or in combination of two or more. The preferable content of these metal salts is between 0.01 and 10% and more preferably between 0.05 and 5.0% by mass. Silicate electrodeposition given, for example, in U.S. Pat. No. 3,658,662 is also effective. Further, surface treatments by combining supports undergone electrolytic graining given in JP-B No. 46-27481, JP-A No. 52-58602 and No. 52-30503 and the above anodizing and hydrophilizing treatments are also useful.

<Intermediate Layer (Undercoating Layer)>

The planographic printing plate precursor of the present invention may also include an intermediate layer (i.e., an undercoat layer) for the purpose of improving adhesiveness between the photosensitive layer and the support and preventing smutting. Specific examples of intermediate layers include those described in JP-B No. 50-7481; JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, and 11-84674; Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091 and 2000-14697.

<Back Coat Layer>

The planographic printing plate precursor of the present invention may also include a back coat layer on the rear face of the support as needed. Suitable examples of back coat layers include coating layers which include organic polymer compounds described in JP-A No. 5-45885 and metal oxides obtained by hydrolysis and polycondensation of an organic or inorganic metal compound described in JP-A No. 6-35174.

Among these, the coating layers having silicon alkoxide compounds such as $Si(OCH_3)_4$, $Si(OC_2H_5)_4$, $Si(OC_3H_7)_4$ and $Si(OC_4H_9)_4$ are especially desirable from the standpoints of low-cost, availability, and excellent development resistance of metal-oxide coating layers that are given by these compounds.

<Plate Snaking>

Plate-making for the planographic printing plate precursor of the present invention at least requires exposure and development processes.

An infrared laser is preferably used as a light source for exposing the planographic printing plate precursor of the present invention. Thermal recording using an ultraviolet lamp or a thermal head is also possible. Especially desirable light sources for exposing images in the present invention are solid-state lasers and semiconductor lasers, which emit infrared rays in a wavelength ranging from 750 to 1400 nm. A desirable laser output is 100 mW or greater. Multibeam laser devices are preferably used from the standpoints of reduction in exposure time. Desirable exposure time for each pixel is microseconds or less. The energy with which the planographic printing plate precursor is irradiated is desirably between 10 and 300 mJ/cm$^2$. Too small exposure energy will result in insufficient cure of the photosensitive layer, while too large exposure energy will cause laser ablation which may damage images.

Light beams from the light source may overlap each other to expose the planographic printing plate precursor of the present invention. "Overlapping" means that a sub-scanning pitch width becomes smaller than a beam diameter. The overlap can be expressed quantitatively by an overlap coefficient (FWHM/sub-scanning pitch width) with the beam diameter represented by the half band width (FWHM) of the beam intensity. The desirable overlap coefficient in the present invention is 0.1 or greater.

Scanning method of the light source in the exposure device of the present invention is not particularly limited, and may be a method of scanning an outside surface of a cylinder, an inside surface of a cylinder, a flat surface, or the like. The light source may be single-channeled or multi-channeled, with a multi-channeled light source desirably used for the outside surface scanning method.

The planographic printing plate precursor of the present invention may be subjected to developing process directly after exposure. A developer used in the developing process may preferably an aqueous alkali solution having a pH of 14 or smaller, and more preferably an aqueous alkali solution having a pH between 8 and 12 and containing an anionic surfactant. Specific examples of aqueous alkali solution include inorganic alkali agents, e.g., trisodium phosphate, tripotassium phosphate, triammonium phosphate, disodium hydrogenphosphate, dipotassium hydrogenphosphate, diammonium hydrogenphosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents, e.g., monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. These alkali agents may be used alone or in combinations of two or more.

The developer used in the developing process of the planographic printing plate precursor of the present invention includes an anionic surfactant preferably in an amount of 1 to 20%, more preferably 3 to 10% by mass. Less than 1% by mass is undesirable because developability is affected, while more than 20% by mass is undesirable because image intensity such as abrasion resistance is affected. Examples of the anionic surfactants include sodium salt of lauryl alcohol sulfate; ammonium salt of lauryl alcohol sulfate; sodium salt of octyl alcohol sulfate; alkylarylsulfonic acid salts such as sodium salt of isopropylnaphthalenesulfonic acid, sodium salt of isobutylnaphthalenesulfonic acid, sodium salt of polyoxyethylene glycol mononaphthylether sulfuric acid ester, sodium salt of dodecylbenzenesulfonic acid, and sodium salt of m-nitrobenzenesulfonic acid; higher alcohol sulfuric acid esters having 8 to 22 carbons such as disodium alkyl sulfate; aliphatic alcohol phosphoric acid ester salts such as sodium salt of cetyl alcohol phosphoric acid ester; alkylamidosulfonic acid salts such as $C_{17}H_{33}CON(CH_3)CH_2CH_2SO_3Na$; and bibasic aliphatic ester sulfonic acid salts such as sodium sulfosuccinic acid dioctylester and sodium sulfosuccinic acid dihexylester.

The developer may include organic solvents that are miscible with water, such as benzyl alcohol as needed. The organic solvent is selected from those having a solubility in water of about 10% by mass or smaller, and more preferably 5% by mass or smaller. Specific examples thereof include 1-phenylethanol, 2-phenylethanol, 3-phenylpropanol, 1,4-phenylbutanol, 2,2-phenylbutanol, 1,2-phenoxyethanol, 2benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The content of the organic solvents is preferably between 1 and 5% by mass, with respect to the total mass of the developer. The amount of the organic solvents is closely related to the amount of surfactant. It is preferable that the amount of the anionic surfactant is increased appropriately as the amount of the organic solvents is increased. This is because a larger amount of organic solvent is used where the amount of the anionic surfactant is small, the organic solvent solves insufficiently, resulting in insufficient developability.

The developer may also include additives such as anti-foamers and water softeners as needed. Examples of water softeners include polyphosphate salts such as $Na_2P_2O_7$, $Na_5P_3O_3$, $Na_3P_3O_9$, $Na_2O_4P(NaO_3P)PO_3Na_2$, and Calgon (sodium polymetaphosphate); aminopolycarboxylic acids (e.g., ethylenediamine tetraacetic acid, the potassium and sodium salts thereof; diethylenetriamine pentaacetic acid, the potassium and sodium salts thereof; triethylenetetramine hexaacetic acid, the potassium and sodium salts thereof; hydroxyethylethylenediamine triacetic acid, the potassium and sodium salts thereof; nitrilotriacetic acid, the potassium and sodium salts thereof; 1,2-diaminocyclohexane tetraacetic acid, the potassium and sodium salts thereof; 1,3-diamino-2-propanol tetraacetic acid, the potassium and sodium salts thereof); other polycarboxylic acids (e.g., 2-phosphonobutanetricarboxylic acid-1,2,4, the potassium and sodium salts thereof; 2-phosphonobutanonetricarboxylic acid-2,3,4, and the potassium and sodium salts thereof); and organic phosphonic acids (e.g., 1-phosphonoethanetricarboxylic acid-1,2,2, the potassium and sodium salts thereof; 1-hydroxyethane-1,1-diphosphonic acid, the potassium and sodium salts thereof; aminotrimethylenephosphonic acid, and the potassium and sodium salts thereof). The optimal amount of the water softeners will vary depending on the hardness and amount of the hard water, but generally is between 0.01 and 5%, more preferably between 0.01 and 0.5% by mass in the developing solution.

In the case in which an automatic developing machine is used to develop the planographic printing plate precursors, fatigue in the developer is caused by repeated processing. The fatigued developer may be refreshed by adding a replenisher or fresh developer. Replenishment is desirably conducted according to the method given in U.S. Pat. No. 4,882,246. Developers given in JP-A No. 50-26601 and No. 58-54341 and JP-B No. 56-39464, No. 56-42860 and No. 57-7427 may be desirably used.

The thus developed planographic printing plate precursor may be subjected to post-treatments with washing water, a rinse solution containing surfactant and the like, or a desensitizing solution containing gum arabic, a starch derivative, and the like, as described in JP-A No. 54-8002, No. 55-115045, No.59-58431, and the like. These processes may be combined for post treatments of the planographic printing plate precursor of the present invention.

During the plate-making of the planographic printing plate precursors of the invention, application of heat or light onto the entire surfaces of developed images is effective in order to improve image intensity and printing durability.

While the heating after development may be carried out under severe conditions, an usual heating temperature is between 200 and 500° C., from the standpoints of sufficient enhancement of image intensity and suppression of damages due to light to the support and image portions.

The thus obtained planographic printing plate is incorporated in offset printing presses for use in printing sheets.

Stains or smuts formed on the planographic printing plate during repeated printing may be removed using plate cleaners. Any known conventional plate cleaners for PS plates can be used, such as those manufactured by Fuji Photo Film Co., Ltd., e.g., CL-1, CL-2, CP, CN-4, CN, CG-1, PC-1, SR and IC.

EXAMPLES

The present invention is described in detail below with reference to examples, but the present invention is not limited to these examples alone.

First, preparation of typical compounds for the polymer (B) having on a side chain thereof a phenyl group substituted by a vinyl group and a monomer (C) having in a molecule thereof at least two phenyl groups each substituted by a vinyl group is described below.

Synthesis Example 1

Synthesis of Specific polymer P-1

To a suspension of 150 g of bismuthiol (2,5-dimercapto-1,3,4-thiadiazole) in 600 mL of methanol, 101 g of triethylamine was added gradually while cooled, to give a homogeneous solution. After dropwise addition of p-chloromethylstyrene (trade name: CMS-14, manufactured by Seimi Chemical) over 10 minutes at room temperature, the solution was stirred for 3 hours, allowing the reaction product to precipitate gradually. After stirring, the solution was cooled in an ice bath until the internal temperature reaches 10° C. and filtered under reduced pressure to separate the precipitate. The precipitate was washed with methanol and dried in a vacuum dryer for 1 day, to give the following compound (monomer) at a yield of 75%.

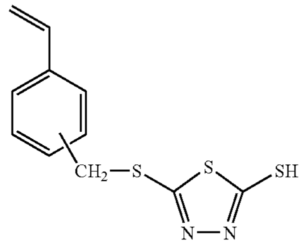

To a 1-liter four-neck flask equipped with a stirrer, nitrogen inlet, thermometer, and reflux condenser containing 40 g of above-obtained monomer, 70 g of methacrylic acid, 200 mL of ethanol, and 50 mL of distilled water were added. Additionally, to the solution cooled in a water bath, 110 g of triethylamine was added while stirring. The solution was heated under a nitrogen atmosphere until the internal temperature reaches 70° C. Polymerization was initiated by addition of 1 g of azobisisobutyronitrile (AIBN) at that temperature. After 6 hours of heating and stirring, the polymer solution was cooled to room temperature. A part of the solution was withdrawn and adjusted to a pH of about 3 by addition of a dilute hydrochloric acid. A polymer having the following structure was obtained by pouring the above solution into water.

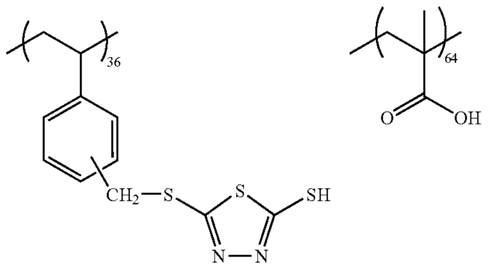

To the rest of the polymer solution, 100 g of 1,4-dioxane and 23 g of p-chloromethylstyrene were added, and the resulting solution was stirred at room temperature for 15 hours. 80 to 90 g of conc. hydrochloric acid (35 to 37% aqueous solution) was then added to the solution. After confirming that the pH of the solution had become 4 or less, the solution was poured into 3 liters of distilled water. Resulting polymer precipitate was separated by filtration, washed several times with distilled water, and dried in a vacuum dryer for 1 day. In this manner, the desirable specific polymer P-1 was obtained at a yield of 90%. Molecular-weight measurement by gel-permeation chromatography revealed that the polymer has a weight average molecular weight of 90,000 (as polystyrene). The structure of specific polymer P-1 was confirmed by proton NMR.

Synthesis Example 2

Synthesis of Specific monomer C-5

To a suspension of 89 g of thiocyanuric acid in 1.5 liters of methanol, a 30% aqueous solution containing 84 g of potassium hydroxide was gradually added under cooling, to give a homogeneous solution. To the solution, 230 g of p-chloromethylstyrene was added at room temperature gradually so that the internal temperature does not exceed 40° C. Although the product precipitates soon after the addition, the stirring was continued for 3 hours. Then, the product was separated by filtration. The product was washed with methanol and dried in a vacuum dryer for 1 day, to give the specific monomer (C-5) at a yield of 90%.

Examples 1 through 3

<Preparation of Support>

0.3 mm thick, 1030 mm wide aluminum sheets (material JIS A 1050) were subjected to surface treatments below.

The surface treatments were conducted sequentially in the following steps (a) through (f). The liquid remaining on the aluminum plate after each treatment or water washing was removed with a nip roller.

(a) An aluminum plate was etched in a solution containing sodium hydroxide at a concentration 26 wt % and aluminum ion at a concentration of 6.5 wt % at a temperature of 70° C., until 5 $g/m^2$ of the aluminum surface was corroded. The etched plate was then washed with water.

(b) The aluminum plate was subjected to a desmutting treatment of spraying an aqueous 1 wt % nitric acid solution (containing aluminum ion at 0.5 wt %) at a temperature of 30° C., and then washed with water.

(c) The aluminum plate was then subjected to an electrochemical surface roughening treatment by applying a 60-Hz alternate current voltage continuously. The electrolyte used for the treatment was an aqueous 1 wt % nitric acid solution (containing 0.5 wt % of aluminum ion and 0.007 wt % of ammonium ion) at a temperature of 30° C. The electrochemical surface roughening treatment was conducted using an alternate-current power source having a time required for the electric current to increase from zero to peak (TP) of 2 msec, a duty ratio of 1:1, and a trapezoidal waveform; and a carbon electrode as the reference electrode. A ferrite electrode was used as the auxiliary anode. The electric current density was 25 $A/dm^2$ at the peak of electric current. The total amount of electricity used for this treatment was 250 $C/cm^2$ when the aluminum plate was an anode. A part (5%) of the electricity from the power source was applied to the auxiliary electrode. The aluminum plate was then washed with water.

(d) The aluminum plate was etched by spraying a solution containing sodium hydroxide at a concentration 26 wt % and aluminum ion at a concentration of 6.5 wt % at 35° C., until 0.2 $g/m^2$ of the aluminum was corroded. Then, the smutting components mainly including aluminum hydroxide formed during the electrochemical surface roughening using the alternate current above were removed. Next, the edge portions of the generated pits were corroded and smoothened. The aluminum plate was then washed with water.

(e) The aluminum plate was subjected to a desmutting treatment of spraying an aqueous 25 wt % sulfuric acid solution (containing aluminum ion at a concentration 0.5 wt %) at a temperature of 60° C. The aluminum plate was then washed with sprayed water.

(f) The aluminum plate was subjected to an anodizing treatment in an electrolyte containing sulfuric acid at a concentration 170 g/L (containing 0.5 wt % of aluminum ion) at a temperature of 33° C. at an electric current density of 5 ($A/dm^2$) for 50 seconds. The aluminum plate was then washed with water. The obtained anodic oxide film was 2.7 $g/m^2$.

The thus obtained aluminum support had a surface roughness Ra of 0.27 (measured by Surfcom, having a probe tip diameter of 2 μm, manufactured by Tokyo Seimitsu Co., Ltd.), surface area ratio ΔS of 75%, and steepness a45 of 44% (measured by SPA300/SPI3800N, manufacture by Seiko Instruments Inc.).

<Preparation of Photosensitive Layers>

Subsequently, a recording layer-coating solution described below was prepared. The recording layer-coating solution was applied onto the surface-treated aluminum support so that the dried thickness of the coating solution would be 1.4 μm. The support was dried in a drier at 70° C. for 5 minutes, to give planographic printing plate precursors of Examples 1 through 3.

<Recording Layer Coating Solution>

| | |
|---|---|
| Specific polymer P-1 (component (B)) | 10 parts by mass |
| Photoradical generator BC-6 (component (A)) | 2 parts by mass |
| Photoradical generator T-4 (component (A)) | 2 parts by mass |
| Specific monomer C-5 (component (C)) | 3.5 parts by mass |
| Infrared absorbent (S-4) (component (D)) | 0.5 part by mass |
| Specific dye (shown in Table 1) | 0.3 part by mass |
| Dioxane | 70 parts by mass |
| Cyclohexane | 20 parts by mass |

Comparative Example 1

Comparative Example 1 was obtained by producing a planographic printing plate precursor in the same manner as in Example 1 except that no specific dye (E) was added in the photosensitive layer-coating solution of Example 1.

Comparative Example 2

Comparative Example 2 was obtained by producing a planographic printing plate precursor in the same manner as in Example 1 except that the specific dye (E) was changed to phthalocyanine pigment in the photosensitive layer-coating solution of Example 1.

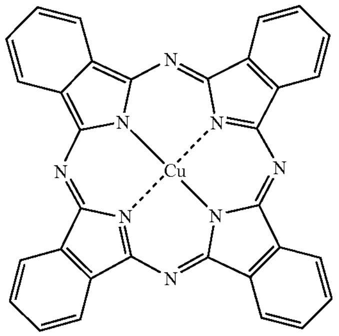

<Evaluation>

1. Evaluation of Photosensitivity (Sensitivity) of Planographic Printing Plate Precursor The photosensitive materials (planographic printing plate precursors of the Example and Comparative Examples) were exposed using a Trendsetter 3244 VX, by Creo Co., equipped with a water-cooling 40W infrared semiconductor laser. A 50% screen tint image with a resolution of 175 lpi was exposed at the rotational speed of outer drum surface at 150 rpm, with the output ranging between 0 and 8 W, and at increments of 0.15 log E. The exposure was conducted at a temperature of 25° C. and a humidity of 50% RH.

Subsequent to the exposure, the photosensitive materials were developed at 30° C. for 10 seconds using a developer having 6% by mass of sodium metasilicate dissolved therein. The sensitivity of the planographic printing plate precursors was obtained in terms of a minimum exposure energy at which screen tint images on the developed planographic printing plate precursors became 50%. The results are given in Table 1.

2. Evaluation of Storage Stability

The planographic printing plate precursors of the examples were left for moisture conditioning at a temperature of 25° C. and a humidity of 40% RH for 2 hours. Then, the planographic printing plate precursors were wrapped in aluminum craft and stored for 3 days at a temperature of 60° C. Samples were obtained and developed under the same conditions as those in the evaluation of sensitivity. The density in non-image portions was measured using a Macbeth reflection densitometer RD-918. The difference Δfog in density in the non-image portions at the time of evaluation of storage stability with respect to the density measured at the time of evaluation of sensitivity was used as an index of the storage stability. Smaller Δfog indicates better storage stability, and planographic printing plate precursors with Δfog of 0.02 or smaller are practically usable. The results are given in Table 1.

3. Evaluation of Stability Under Safelight Illumination

The planographic printing plate precursors of the examples were illuminated using an UV-cut fluorescent lamp K-40A, by Matsushita Electric Industrial Co., Ltd. at a temperature of 25° C. and a humidity of 30% RH for 2 hours at 400 lux. Samples were obtained and developed under the same conditions as those in the evaluation of sensitivity. The density in non-image portions was measured. The stability under safelight illumination was obtained in terms of the time needed to have the density to increase 0.01. The results are given in Table 1.

4. Evaluation of Plate-Comparability

Visibility of the screen tint images obtained in the evaluation of sensitivity was judged on a scale of 1 to 5 by being viewed. The images with the scale 3 or greater are practically usable, with the scale 1 being invisible at all. The results are given in Table 1.

TABLE 1

| | Dye | Sensitivity (mJ/cm$^2$) | Δfog | Stability under safelight illumination (minute) | Plate-comparability |
|---|---|---|---|---|---|
| Example 1 | D-3 | 100 | 0.02 | 60 | 4 |
| Example 2 | D-4 | 105 | 0.01 | 60 | 4 |
| Example 3 | D-6 | 105 | 0 | 60 | 5 |
| Comparative Example 1 | None | 100 | 0.05 | 15 | 1 |
| Comparative Example 2 | Phthalo-cyanine pigment | 100 | 0.05 | 15 | 3 |

As apparent from Table 1, the planographic printing plate precursors of Examples 1 to 3 were superior in all of sensitivity, storage stability, stability under safelight illumination and plate-comparability. In contrast, the planographic printing plate precursors of Comparative Examples 1 and 2 had defects in storage stability, stability under safelight illumination and plate-comparability and thus were not practically usable.

What is claimed is:

1. A photosensitive composition, comprising:

a compound which generates a radical upon being heated or exposed to light;

a polymer having on a side chain thereof a phenyl group substituted by a vinyl group;

a monomer having in a molecule thereof at least two phenyl groups each substituted by a vinyl group;

an infrared absorbent; and a dye having an absorption maximum wavelength in a range from 500 to 700 nm, wherein the dye is a compound selected from the group consisting of D-1, D-2, D-3, D-4, D-5, D-6 and D-7;

D-1

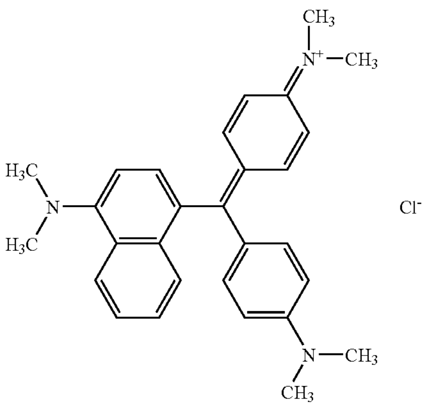

-continued

D-2

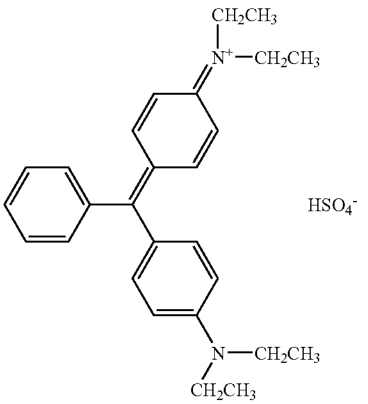

D-3

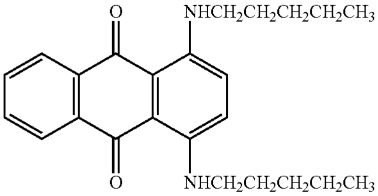

D-4

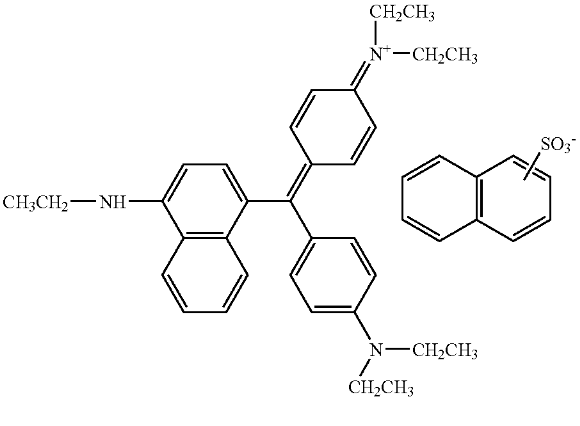

D-5

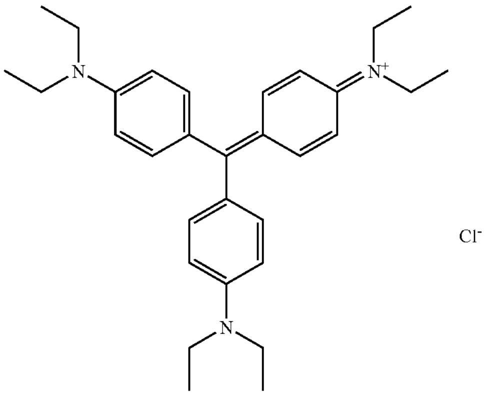

-continued

D-6

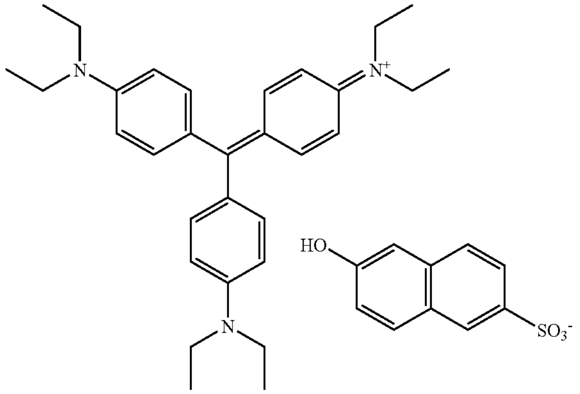

D-7

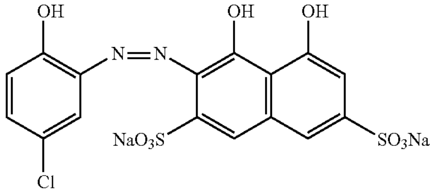

2. The photosensitive composition according to claim 1, wherein the dye is a triarylmethane dye.

3. The photosensitive composition according to claim 1, wherein the amount of the dye used in the photosensitive composition is 0.5 to 5% by mass with respect to non-volatile components of the entire composition.

4. The photosensitive composition according to claim 1, wherein the compound which generates a radical is an organic boron salt that includes an organic boron anion represented by the following formula (1):

(1)

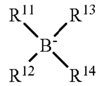

wherein $R^{11}$, $R^{12}$, $R^{13}$, and $R^{14}$, which may be the same as or different from each other, each represent an alkyl group, aryl group, aralkyl group, alkenyl group, alkynyl group, cycloalkyl group or heterocyclic group.

5. The photosensitive composition according to claim 4, wherein the organic boron salt is a salt of an organic boron anion and one of an alkali metal ion and an onium ion.

6. The photosensitive composition according to claim 1, wherein the compound which generates a radical is a trihaloalkyl-substituted compound.

7. The photosensitive composition according to claim 1, wherein the polymer has on a side chain thereof a group represented by the following formula (2):

(2)

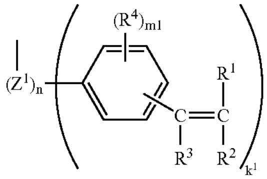

wherein $Z^1$ represents a linking group; $R^1$, $R^2$ and $R^3$ each independently represent a hydrogen atom, halogen atom, carboxyl group, sulfo group, nitro group, cyano group, amide group, amino group, alkyl group, aryl group, alkoxy group, or aryloxy group, which may be substituted by an alkyl group, amino group, aryl group, alkenyl group, carboxyl group, sulfo group and hydroxy group; $R^4$ represents a substitutable group or atom; n represents 0 or 1; $m^1$ represents 0 to 4; and $k^1$ represents 1 to 4; the linking group represented by $Z^1$ includes at least one of an oxygen atom, a sulfur atom, an alkylene group, an alkenylene group, an arylene group, —N($R^5$)—, —C(O)—O—, —C($R^6$)=N—, —C(O)—, a sulfonyl group, and a group having a heterocyclic structure which may be used alone or in combinations of two or more; $R^5$ and $R^6$ each independently represent a hydrogen atom, alkyl group, or aryl group; and the above-listed linking groups may have a substituent selected from an alkyl group, an aryl group, and a halogen atom.

8. The photosensitive composition according to claim 7, wherein the linking group in the polymer represented by formula (2) includes a heterocyclic ring.

9. The photosensitive composition according to claim 1, wherein the polymer is a copolymer that has a carboxyl group-containing monomer as a copolymerizable component.

10. The photosensitive composition according to claim 9, wherein the amount of the carboxyl group-containing monomer in the copolymer is between 5 and 99% by mass.

11. The photosensitive composition according to claim 1, wherein the polymer is included in an amount between 20 and 80% by mass relative to the total solids of the photosensitive composition.

12. The photosensitive composition according to claim 1, wherein the monomer is a compound represented by the following formula (3):

(3)

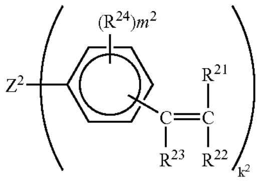

wherein $Z^2$ represents a linking group; $R^{21}$, $R^{22}$ and $R^{23}$ each independently represent a hydrogen atom, a halogen atom, a carboxyl group, a sulfo group, a nitro group, a cyano group, an amide group, an amino group, an alkyl group, an aryl group, an alkoxy group, or an aryloxy group, which may be substituted by an alkyl group, an amino group, an aryl group, an alkenyl group, a carboxyl group, a sulfo group, or a hydroxy group; $R^{24}$ represents a substitutable group or atom; $m^2$ represents an integer from 0 to 4; and $k^2$ represents an integer from 2 or greater; the linking group represented by $Z^2$ includes at least one of an oxygen atom, a sulfur atom, an alkylene group, an alkenylene group, an arylene group, —N($R^5$)—, —C(O)—O—, —C($R^6$)=N—, —C(O)—, a sulfonyl group, a group having a heterocyclic structure, and a group having a benzene ring structure, which may be used alone or in combinations of two or more; $R^5$ and $R^6$ each independently represent a hydrogen atom, an alkyl group, or aryl group; and the above-listed linking groups may have a substituent selected from an alkyl group, an aryl group, and a halogen atom.

13. The photosensitive composition according to claim 12, wherein the linking group in the monomer represented by formula (3) includes a heterocyclic ring.

14. The photosensitive composition according to claim 1, wherein the infrared absorbent is a cationic dye.

15. The photosensitive composition according to claim 1, wherein the infrared absorbent is included in an amount of 3 to 300 mg per 1 $m^2$ of a photosensitive layer.

16. An image recording material comprising a support and a photosensitive layer containing the photosensitive composition of the claim 1 disposed on the support.

17. The image recording material according to claim 16, wherein the image recording material is a planographic printing plate precursor.

18. The image recording material according to claim 17, wherein the dried amount of the coated photosensitive layer is 0.5 to 5 $g/m^2$ by mass.

19. The image recording material according to claim 17, wherein a development rate at non-exposed portions with respect to an alkali developer having a pH of 10 to 13.5 is 80 nm/sec or greater, and a permeation rate of the alkali developer at exposed portions is 100 nF/sec or smaller.

* * * * *